(12) United States Patent
Tang et al.

(10) Patent No.: US 7,528,439 B2
(45) Date of Patent: May 5, 2009

(54) VERTICAL WRAP-AROUND-GATE FIELD-EFFECT-TRANSISTOR FOR HIGH DENSITY, LOW VOLTAGE LOGIC AND MEMORY ARRAY

(75) Inventors: Sanh D. Tang, Boise, ID (US); Robert J. Burke, Boise, ID (US); Anand Srinivasan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 252 days.

(21) Appl. No.: 11/438,419

(22) Filed: May 23, 2006

(65) Prior Publication Data

US 2007/0048943 A1 Mar. 1, 2007

Related U.S. Application Data

(62) Division of application No. 10/928,317, filed on Aug. 30, 2004, now Pat. No. 7,241,655.

(51) Int. Cl.
*H01L 29/732* (2006.01)

(52) U.S. Cl. ............ 257/327; 257/328; 257/329; 257/401; 257/371; 257/E27.067; 257/E27.096; 257/E29.118; 257/E29.122; 257/E29.131; 257/E29.267; 257/E29.274

(58) Field of Classification Search ........ 257/327, 257/328, 329, 401, 371, E27.067, E27.096, 257/E29.118, E29.122, E29.131, E29.267, 257/E29.274
See application file for complete search history.

(56) References Cited

U.S. PATENT DOCUMENTS

| | | | |
|---|---|---|---|
| 4,811,071 A | 3/1989 | Roloff | |
| 4,881,105 A * | 11/1989 | Davari et al. | 257/334 |
| 5,001,526 A | 3/1991 | Gotou | |
| 5,087,581 A * | 2/1992 | Rodder | 438/268 |
| 5,162,248 A | 11/1992 | Dennison et al. | |
| 5,291,438 A * | 3/1994 | Witek et al. | 365/149 |
| 5,324,673 A * | 6/1994 | Fitch et al. | 438/156 |
| 5,376,575 A | 12/1994 | Kim et al. | |
| 5,414,289 A * | 5/1995 | Fitch et al. | 257/329 |
| 5,451,538 A | 9/1995 | Fitch et al. | |
| 5,497,017 A | 3/1996 | Gonzales | |
| 5,519,236 A | 5/1996 | Ozaki | |
| 5,578,850 A | 11/1996 | Fitch et al. | |
| 5,668,038 A | 9/1997 | Huang et al. | |
| 5,753,947 A | 5/1998 | Gonzalez | |
| 5,909,618 A | 6/1999 | Forbes et al. | |
| 5,933,717 A | 8/1999 | Hause et al. | |
| 6,025,247 A | 2/2000 | Chang et al. | |
| 6,027,975 A | 2/2000 | Hergenrother et al. | |
| 6,096,596 A | 8/2000 | Gonzalez | |
| 6,096,598 A | 8/2000 | Furukawa et al. | |
| 6,104,061 A | 8/2000 | Forbes et al. | |
| 6,191,448 B1 | 2/2001 | Forbes et al. | |
| 6,506,638 B1 | 1/2003 | Yu | |
| 6,548,856 B1 | 4/2003 | Lin et al. | |

(Continued)

*Primary Examiner*—Ngan Ngo
*Assistant Examiner*—Benjamin Tzu-Hung Liu
(74) *Attorney, Agent, or Firm*—Dickstein Shapiro LLP

(57) ABSTRACT

A vertical transistor having a wrap-around-gate and a method of fabricating such a transistor. The wrap-around-gate (WAG) vertical transistors are fabricated by a process in which source, drain and channel regions of the transistor are automatically defined and aligned by the fabrication process, without photolithographic patterning.

9 Claims, 30 Drawing Sheets

U.S. PATENT DOCUMENTS 6,552,382 B1 4/2003 Wu
6,660,590 B2 12/2003 Yoo
6,670,642 B2 12/2003 Takaura et al.
6,700,150 B1 3/2004 Wu

* cited by examiner

VERTICAL WRAP-AROUND-GATE FIELD-EFFECT-TRANSISTOR FOR HIGH DENSITY, LOW VOLTAGE LOGIC AND MEMORY ARRAY

This application is a divisional of application Ser. No. 10/928,317, filed on Aug. 30, 2004, now U.S. Pat. No. 7,241,655 which is hereby incorporated by reference in its entirety.

FIELD OF THE INVENTION

This invention relates to the field of semiconductor transistors, and more specifically to transistors which are suitable for use in high density semiconductor structures.

BACKGROUND OF THE INVENTION

There is ever-present pressure in the semiconductor industry to develop smaller and more highly integrated devices. As the demand increases for cheaper, faster, less power consuming yet more powerful integrated circuits such as microprocessors and memory devices, the transistor packing density of the integrated circuit must be similarly increased.

As the industry standard approaches smaller and smaller scaled devices, problems with further advancement are presented and it becomes more difficult to produce sub-micron devices that can perform as desired. For example, in producing memory systems for such increasingly compact devices, the goal of expanding or, at least, maintaining memory capacity as cell size shrinks must be attained without resorting to processes that increase the number of masking, deposition, etch and other steps in the production process. In particular, any time a photomasking layer is applied, a subsequent step will also be required, either implant or etch. These additional steps add significantly to manufacturing costs. High capital costs are associated with photolithographic equipment and more complex photo processing, in terms of more photo process steps per level, more equipment, and the use of expensive ultra clean room floor space.

Furthermore, the smallest separation between semiconductor structures using known patterning methods is subject to the physical limitations of how thin a distinguishable line or gap can be formed in a photoresist layer by patterning with a reticle. Thus, use of such photolithographic patterning methods places an upper limit to the highest achievable density of a semiconductor device. In addition, defect density is inevitably increased with each additional photomasking layer, which thereby compromises yield and reliability.

In light of these and other difficulties, the semiconductor industry is in need of a method of fabricating high density semiconductor devices without increasing, or even reducing the use of photolithographic patterning processes to produce the device. Along the same lines, it is also desirable to increase the density of existing memory devices which at least maintains, or perhaps even increases, the memory capacity of the memory cells in the device.

BRIEF SUMMARY OF THE INVENTION

Exemplary embodiments of the invention provide a vertical transistor having a wrap-around-gate and a method of fabricating such a transistor. The wrap-around-gate (WAG) vertical transistors are fabricated by a process in which source, drain and channel regions of the transistor are automatically defined and aligned by the fabrication process, without photolithographic patterning.

These and other features and advantages of the present invention will become more apparent from the following detailed description of the invention provided below with reference to the accompanying drawings.

DETAILED DESCRIPTION OF THE INVENTION

In the following detailed description, reference is made to an exemplary embodiment of the invention. The embodiment is described with sufficient detail to enable those skilled in the art to practice the invention, and it is to be understood that other embodiments may be employed, and that structural and electrical changes may be made without departing from the spirit or scope of the present invention.

The term "substrate" used in the following description may include any semiconductor-based structure that has an exposed semiconductor surface. Such structure must be understood to include silicon, silicon-on insulator (SOI), silicon-on sapphire (SOS), doped and undoped semiconductors, epitaxial layers of silicon supported by a base semiconductor foundation, silicon-germanium, germanium, gallium arsenide, and other semiconductor structures. Also, when reference is made to a substrate in the following description, previous process steps typical in the art and not specifically discussed herein may have been utilized to form regions or junctions in or on the base semiconductor or foundation.

Generally, the present invention includes a process for fabricating a vertical gate FET transistor in a semiconductor wafer in which the gate is formed to wrap-around a channel, and further includes the wrap-around-gate (WAG) transistor formed according to this method. First, the invention is generally described below as a method and structure that may be incorporated in the production of any type of semiconductor circuit that includes at least one FET (field effect transistor). The general description of the invention is exemplified by the semiconductor structure formed and shown in FIGS. 1A-19B. Subsequently, a more specific application of the invention is described with reference to FIGS. 20-45, in which the invention is incorporated into a DRAM memory array.

Figure 1A:
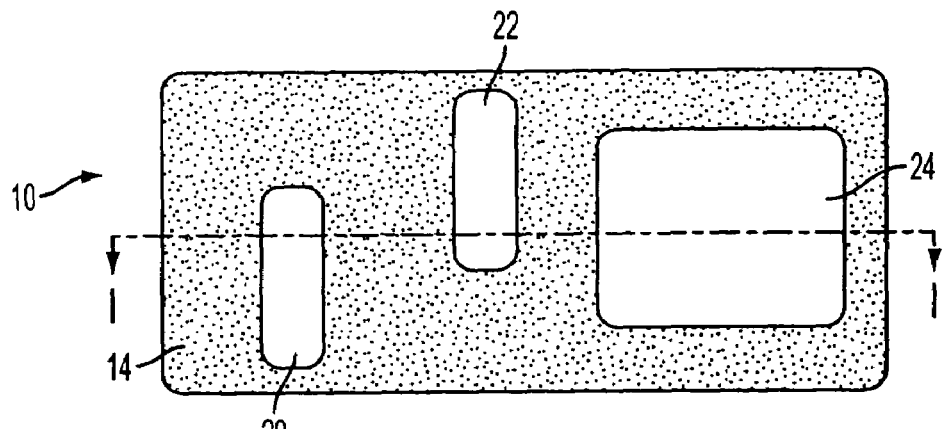
FIG. 1A illustrates a plan view of a substrate which may be used in the fabrication of an exemplary semiconductor structure constructed in accordance with an embodiment of the invention.
Figure 1B:
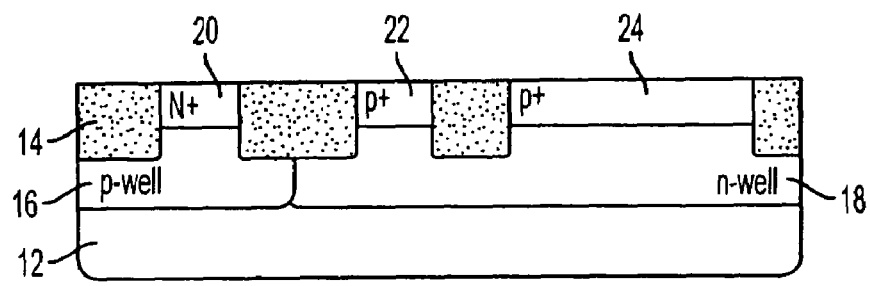
FIG. 1B is a cross-sectional view of the substrate through the line I-I in FIG. 1A.

According to the invention, a semiconductor substrate is prepared to include at least one bottom and/or source region such as providing a doped region in a polysilicon substrate. In the example described herein, FIGS. 1A and 1B illustrate a wafer 10 comprising a semiconductor substrate 12 having a p-well 16 and an n-well 18 defined in the upper portion thereof. An STI (shallow trench isolation) region 14 and n+ and p+ bottom source/drain regions 20, 22, 24 are defined over the p-well 16 and n-well 18.

Figure 2:
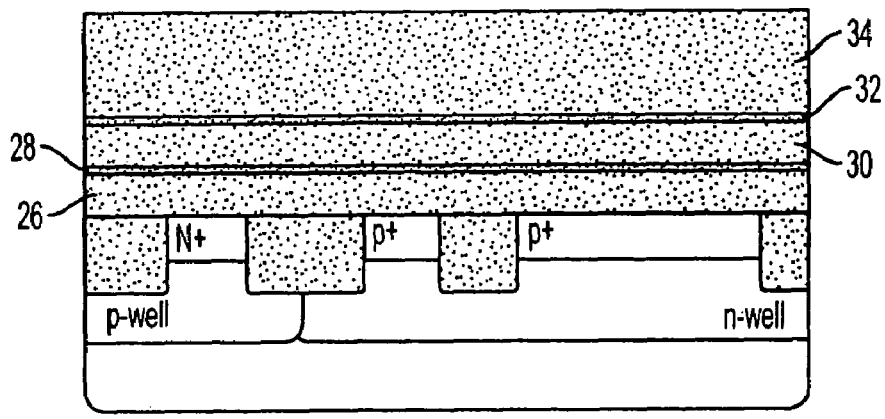
FIG. 2 is a cross-sectional view of the exemplary semiconductor structure at a stage of processing subsequent to that shown in FIGS. 1A-1B.

The upper surface of the wafer 10 is planarized as shown in FIG. 2. A first insulator layer 26 is blanket deposited onto the wafer surface, a nitride (e.g., silicon nitride ($Si_3N_4$)) liner 28 is deposited over the first insulator layer 26, a second insulator layer 30 is deposited over the first nitride liner 28, a second nitride liner 32 is deposited over the second insulator layer 30, and a third insulator layer 34 is deposited over the second nitride liner 32. Thus, alternating layers of an insulator material and a nitride liner are deposited onto the surface of wafer 10. Preferably, each of the first, second and third insulator layers 26, 30, 34 are formed of TEOS (tetraethyl orthosilicate). However, other suitable insulator and etch stop materials may by used for the respective layers 26, 28, 30, 32, 34.

The thickness of first insulator layer 26 will subsequently serve to define the length of the bottom source/drain region of each WAG vertical transistor to be formed, and is preferably between approximately 400 Å to approximately 1000 Å. Similarly, the length of the wrap-around-gate will be defined by the thickness of second insulator layer 30, and is preferably between about 500 Å to approximately 2000 Å. On the other hand, the thickness of the third insulator layer 34 represents the length of the top drain or source region of each WAG vertical transistor to be formed, plus an additional length which is used to form the structure electrically connecting the top drain or source to other elements in the semiconductor circuit. In this regard, the preferred thickness range of the third insulator layer 34 is about 1000 Å to approximately 3000 Å. Additionally, each of the nitride liners 28 and 32 are formed to a thickness of approximately 50 Å.

Figure 3A:
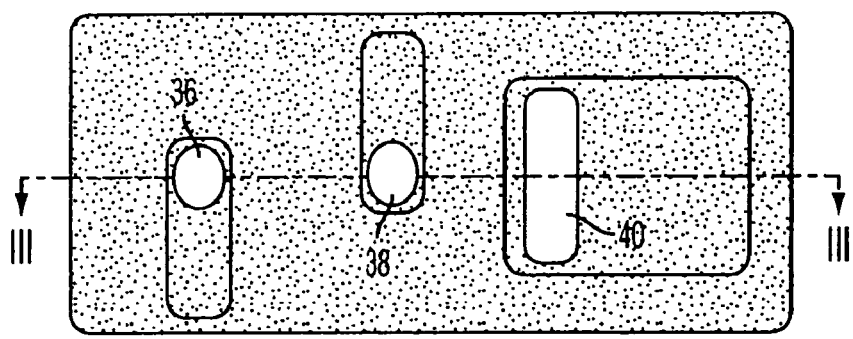
FIG. 3A is a plan view of the exemplary semiconductor structure at a stage of processing subsequent to that shown in FIG. 2.
Figure 3B:
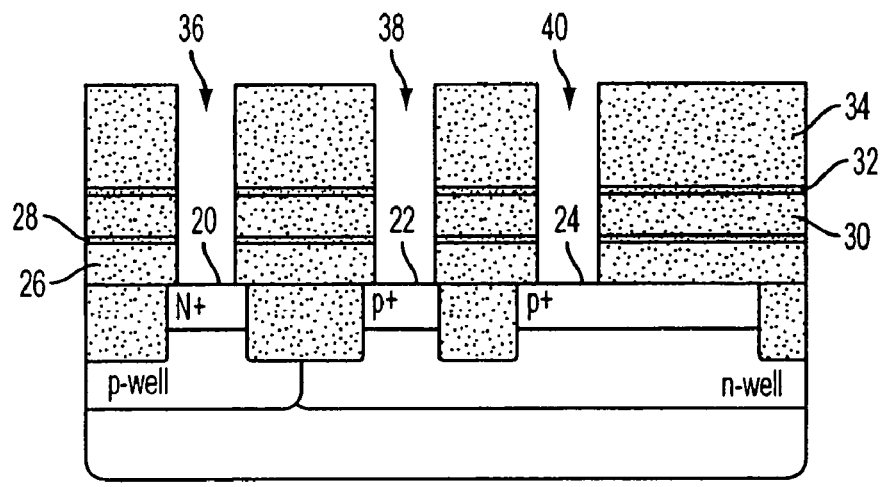
FIG. 3B is a cross-sectional view of the exemplary semiconductor structure through the line III-III in FIG. 3A.

Referring now to FIGS. 3A-3B, the wafer is patterned and etched to form holes 36, 38, 40 through the insulator layers and nitride liners 26, 28, 30, 32, 34 to expose the bottom source drain regions 20, 22, 24. The diameter of each hole 36, 38, 40 defines the size of the transistor channel region to be formed and surrounded by the respective wrap-around-gate. This is the only process in the present invention that uses photolithography during the formation of the transistor gate.

Figure 3C:
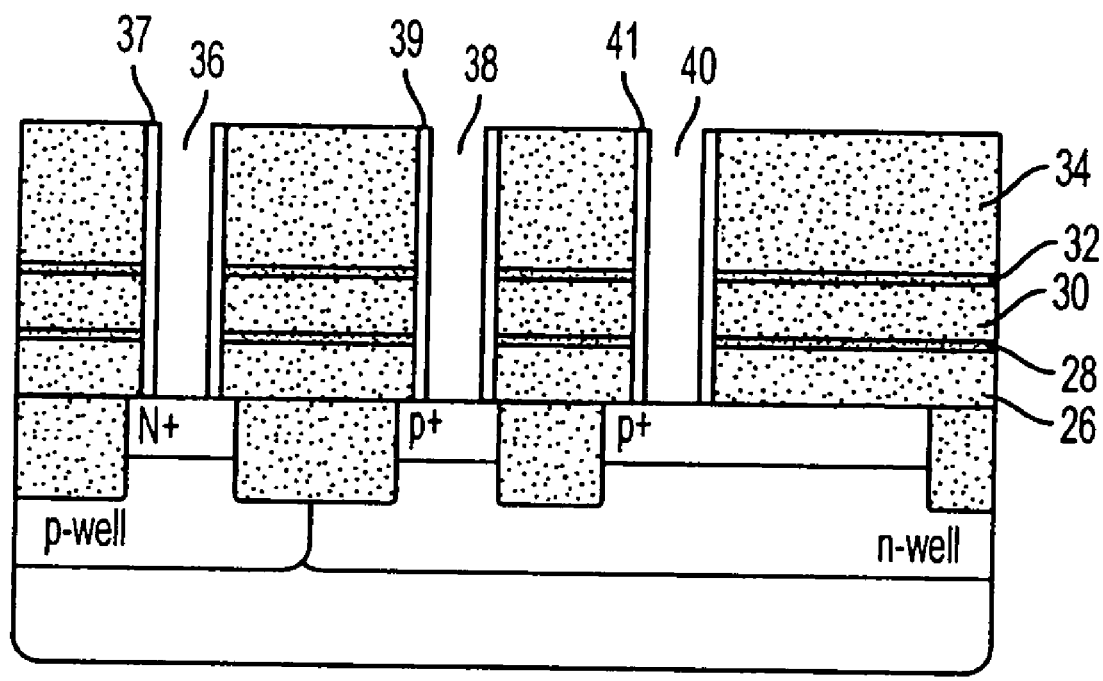
FIG. 3C is a cross-sectional view of the exemplary semiconductor structure at an optional stage of processing subsequent to that shown in FIGS. 3A-3B.

If it is desired to reduce the diameter of the transistor channel region beyond what is achievable using the pattern and etch method, an optional process may be performed to deposit an oxide or nitride layer over all the exposed surfaces of the semiconductor structure. A selective etch is then performed to remove the oxide or nitride layer from the bottom source/drain 20, 22, 24 as well as the horizontal surfaces of the insulator layer 34, resulting in the formation of spacers 37, 39, 41 along the sidewalls of the holes 36, 38, 40 as seen in FIG. 3C. Formation of the spacers, 37, 39, 41 thereby reduces the diameter of the holes 36, 38, 40. Since the thickness of the spacers can be controlled to deposit as much or as little of the oxide or nitride material as desired, the diameter of the holes 36, 38, 40 is not constrained by the physical limitations of photolithography. The diameter of each hole is a critical dimension that will determine the size of the channel region surrounded by each respective wrap-around-gate to be formed, as will become evident further below.

Figure 4:
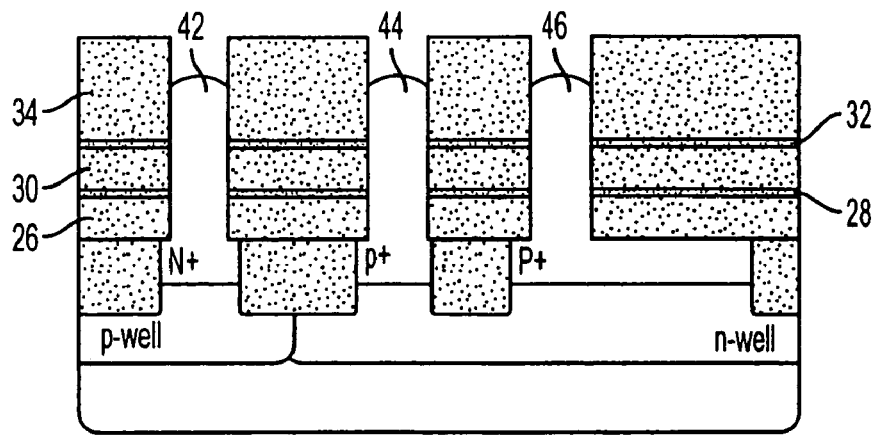
FIG. 4 is a cross-sectional view of the exemplary semiconductor structure at a stage of processing subsequent to that shown in FIGS. 3A-3B.

As shown in FIG. 4, selective epitaxial growth is performed using the bottom source/drain 20, 22, 24 as the seed layer to grow a mono-crystalline silicon pillar 42, 44, 46 in each of the holes 36, 38, 40. The pillars 42, 44, 46 are grown past the nitride liner 32, but preferably to about 500 Å to about 1000 Å below the top surface of the third insulator layer 34. Alternatively, however, the pillars may be grown to or past the upper surface of the insulator layer 34, and then etched back to the target level (range) in the holes 36, 38, 40. As mentioned above, the thickness of the pillars 42, 44, 46 can be controlled by the formation of spacers along the sidewalls of the holes 36, 38, 40.

Figure 5A:
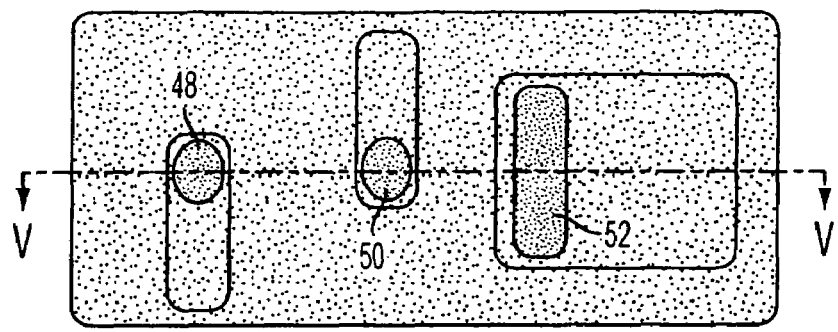
FIG. 5A is a plan view of the exemplary semiconductor structure at a stage of processing subsequent to that shown in FIG. 4.
Figure 5B:
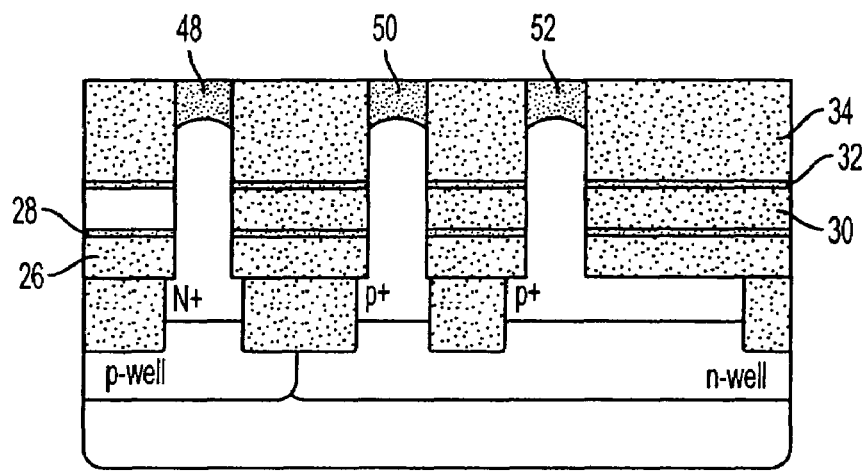
FIG. 5B is a cross-sectional view of the exemplary semiconductor structure through the line V-V in FIG. 5A.

Next, silicon nitride is deposited to completely fill in the remaining space in the holes 36, 38, 40. Any overhanging nitride on the horizontal surface of insulator layer 34 is removed by a dry planar etch, leaving a nitride cap 48, 50, 52 over each of the pillars 42, 44, 46, as shown in FIGS. 5A-5B. The nitride caps 48, 50, 52 serve as hard masks to protect the pillars 42, 44, 46 during subsequent processing.

Figure 6:
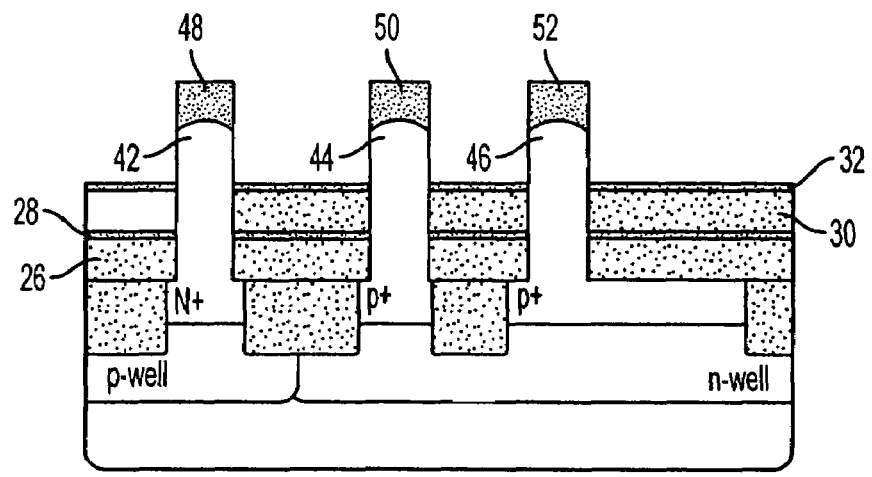
FIG. 6 is a cross-sectional view of the exemplary semiconductor structure at a stage of processing subsequent to that shown in FIGS. 5A-5B.

After forming the nitride caps 48, 50, 52, a wet etch is performed with a diluted hydrofluoric (HF) oxide etchant, for example, to completely remove the third insulator layer 34, leaving the structure seen in FIG. 6. The wet etch should selectively stop on the nitride caps 48, 50, 52, the second nitride liner 32, and the silicon pillars 42, 44, 46.

Figure 7A:
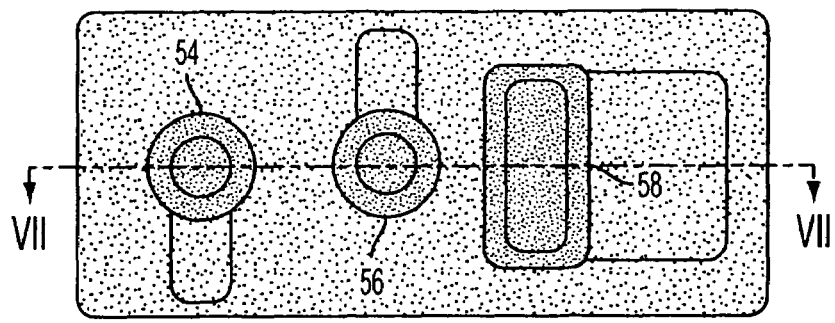
FIG. 7A is a plan view of the exemplary semiconductor structure at a stage of processing subsequent to that shown in FIG. 6.
Figure 7B:
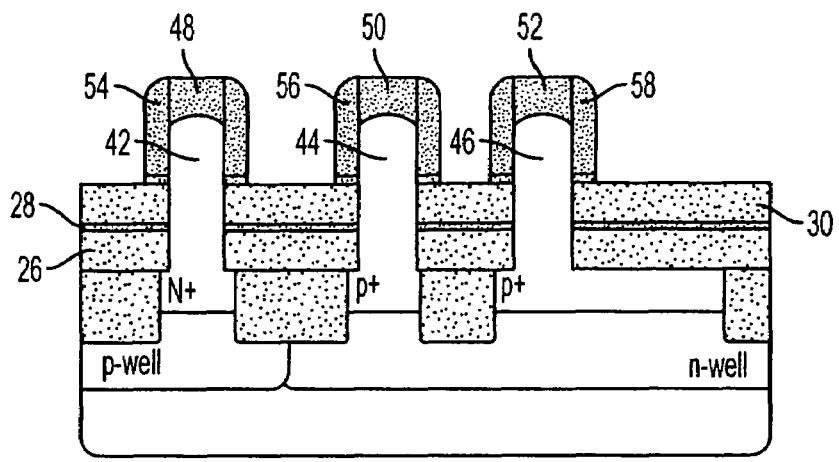
FIG. 7B is a cross-sectional view of the exemplary semiconductor structure through the line VII-VII in FIG. 7A.

As shown in FIGS. 7A-7B, a nitride material is deposited on the semiconductor structure to form spacers 54, 56, 58 along the surfaces of the pillars 42, 44, 46 (or the spacers 37, 39, 41 surrounding the pillars if the process of FIG. 3C is performed) exposed by the removal of the insulator layer 34. All of the nitride material deposited on the horizontal surfaces of the semiconductor structure is removed by dry etching. The nitride liner 32 is also removed by over-etching during the removal process. Preferably, the nitride material is $Si_3N_4$ and each of the resulting spacers 54, 46, 58 has a thickness in the range of approximately 300 Å to approximately 1000 Å.

Figure 8:
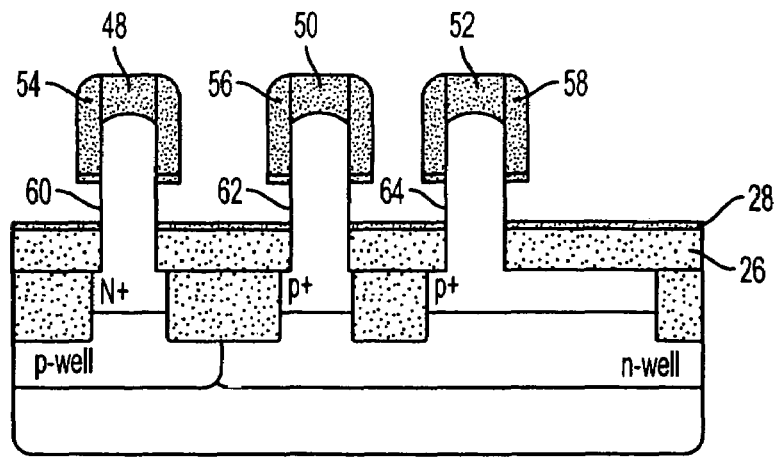
FIG. 8 is a cross-sectional view of the exemplary semiconductor structure at a stage of processing subsequent to that shown in FIGS. 7A-7B.

With the nitride spacers 54, 56, 58 and the nitride caps 48, 50, 52 serving as hard masks and with the nitride liner 32 previously removed, the insulator layer 30 is entirely removed using a wet etch such as with a diluted HF etchant, resulting in the structure shown in FIG. 8. As was the case during the processing shown and described with respect to FIG. 6, the wet etch selectively stops on the nitride spacers 54, 56, 58, the nitride caps 48, 50, 52, the nitride liner 28, and the silicon pillars 42, 44, 46.

In the wet etch process just described, however, if the spacers 37, 39, 41 are formed along the sidewalls in the holes 36, 38, 40 according to the variation shown and described above with respect to FIG. 3C, the wet etch mentioned above for removing the insulator layer 30 would stop at the spacers 37, 39, 41 instead of the silicon pillars 42, 44, 46. In this case, the portions of the spacers 37, 39, 41 exposed by the removal of the insulator layer 30 are removed by a selective etch to expose the sidewalls of the pillars 42, 44, 46 below the nitride spacers 54, 56, 58 and above the insulator layer 26. The nitride liner 28 is also removed during this process, so the resulting structure would look identical to that shown in FIG. 8 except that the nitride liner 28 would not be present.

Figure 9:
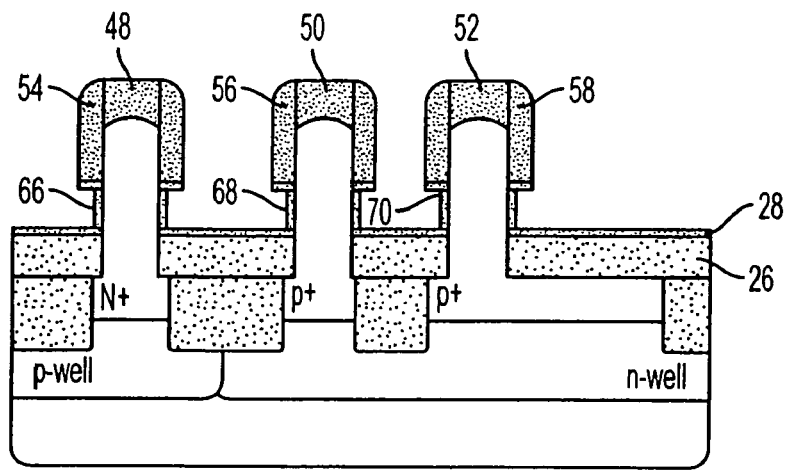
FIG. 9 is a cross-sectional view of the exemplary semiconductor structure at a stage of processing subsequent to that shown in FIG. 8.

With the silicon pillars 42, 44, 46 exposed along the portions 60, 62, 64 below the nitride spacers 54, 56, 58 and above the nitride liner 28 (or the insulator layer 26), a gate dielectric layer is then grown on each of the exposed pillar surfaces 60, 62, 64 by oxidizing the exposed silicon. Alternatively, the gate dielectric layer may be deposited by aluminum oxide, tantatalum oxide, silicon nitride, silicon oxy-nitride, or other suitable dielectric material. As a further option, other appropriate processes may be used to form the gate dielectric layer on the exposed pillar surfaces 60, 62, 64, including, but not limited to, a combination of oxidation and deposition. The gate dielectric layers 66, 68, 70 formed using any of these suitable processes are shown in FIG. 9.

Figure 10A:
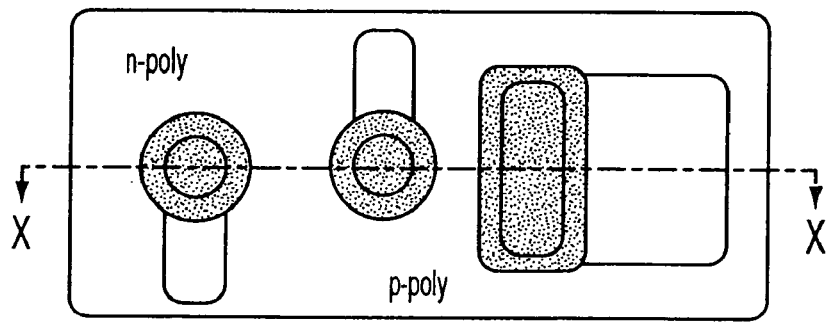
FIG. 10A is a plan view of the exemplary semiconductor structure at a stage of processing subsequent to that shown in FIG. 9.
Figure 10B:
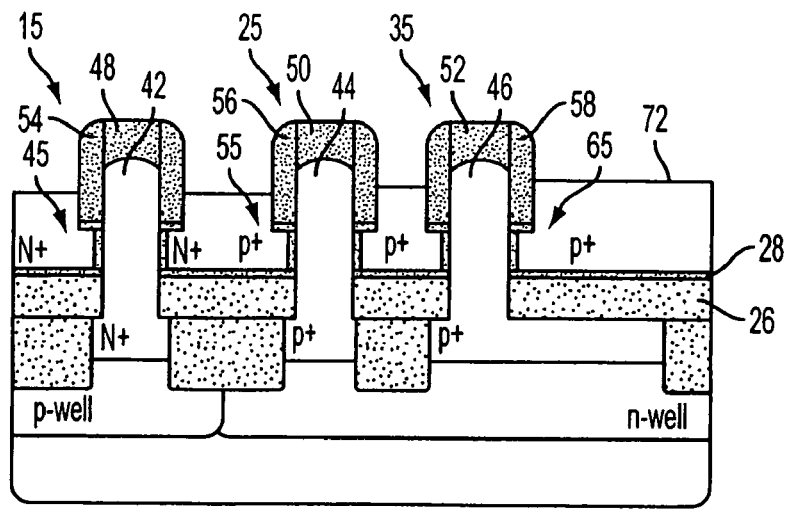
FIG. 10B is a cross-sectional view of the exemplary semiconductor structure through the line X-X in FIG. 10A.

Referring now to FIGS. 10A-10B, in-situ doped polysilicon or undoped polysilicon is blanket deposited over the nitride liner 28 (or the insulator layer 26) to a thickness at least covering the nitride caps 48, 50, 52. Either blanket etching or CMP may then be used to remove the deposited polysilicon until the nitride caps are exposed. The polysilicon layer 72 is further recessed by etching it to approximately the bottom of the nitride spacers 54, 56, 58 (the former level of the nitride liner 32). The thickness of the polysilicon layer 72 may vary and is not critical to practice the invention.

If the polysilicon originally blanket deposited in FIGS. 10A-10B is undoped, the recessed polysilicon layer 72 is doped to be n+ or p+ as appropriate for the respective transistor gate. As an alternative to using polysilicon as the transistor gate material, a stable metal/alloy such as titanium nitride (TiN), tungsten nitride (WN), tungsten (W), etc., may be deposited as layer 72 instead of polysilicon. The metal/alloy layer would then be recessed in the same manner as described above.

Deposition of the polysilicon (or other conductive) layer 72 simultaneously forms the wrap-around-gates 45, 55, 65 in this exemplary embodiment when the polysilicon (or other conductive) material surrounds the gate oxide-coated pillars 42, 44, 46, respectively. Together with the bottom and top source/drain regions and the channel embodied within the pillars 42, 44, 46, and the gate dielectric layers 66, 68, 70 encircling the channel region of the pillars 42, 44, 46, the wrap-around-gates 45, 55, 65 constitute the essential elements of the WAG vertical transistors 15, 25, 35.

Figure 11A:
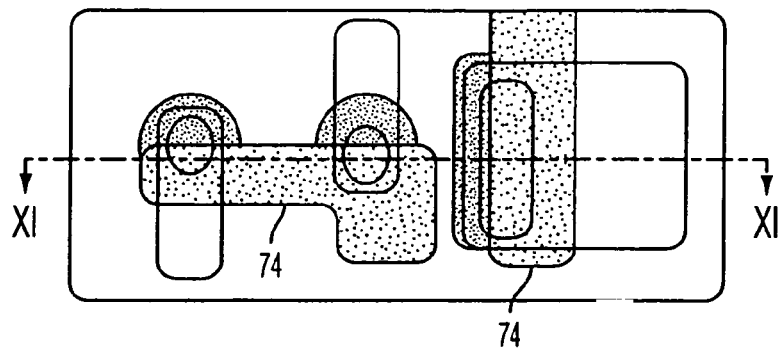
FIG. 11A is a plan view of the exemplary semiconductor structure at a stage of processing subsequent to that shown in FIGS. 10A-10B.
Figure 11B:
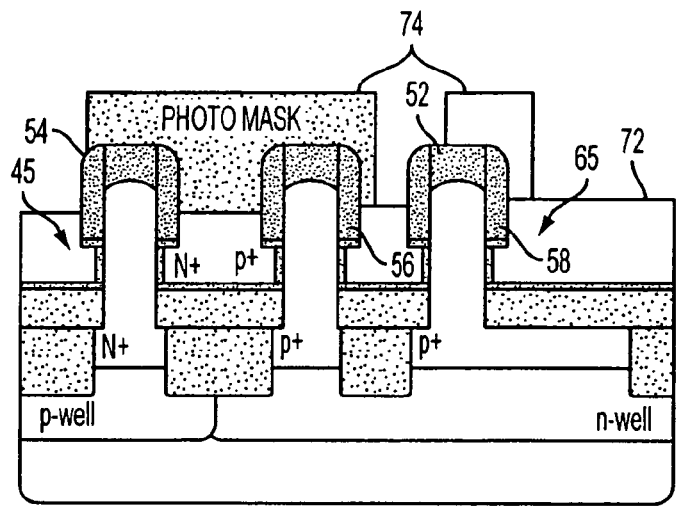
FIG. 11B is a cross-sectional view of the exemplary semiconductor structure through the line XI-XI in FIG. 11A.

Next, the interconnection arrangement of the wrap-around-gates 45, 55, 65 is defined by patterning the polysilicon (or other conductive material) layer 72. Specifically, a photoresist mask 74 is patterned according to the desired gate interconnection arrangement over the appropriate regions of the wafer structure, as shown in FIGS. 11A-11B. Dry etching is performed to remove the portions of the polysilicon (or other conductive material) layer 72 left uncovered by the photoresist mask 74, and then selectively stops on the nitride caps 48, 50, 52 and the nitride liner 28 or at the insulator layer 26. After etching the polysilicon layer 72, the photoresist mask 74 is removed, leaving the gate interconnect pattern 73 shown in FIG. 12.

It is important to note that the wrap-around-gates are defined by the portion of the conductive layer 72 surrounding the pillars 42, 44, 46 under the nitride spacers 54, 56, 58, and not the gate interconnect patterning process. In particular, the length "y" of each wrap-around-gate is defined between the bottom of the spacers 54, 56, 58 and the nitride liner 28 or the insulator layer 26 (see FIG. 12). Additionally, defining the wrap-around-gate by the insulator layer 26 and the nitride spacer 54, 56, 58 automatically aligns the wrap-around-gate between the source and drain regions along the pillar 42, 44, 46. Further still, the thickness of the wrap-around-gate is determined by the thickness "x" of the nitride spacers 54, 56, 58.

Figure 12:
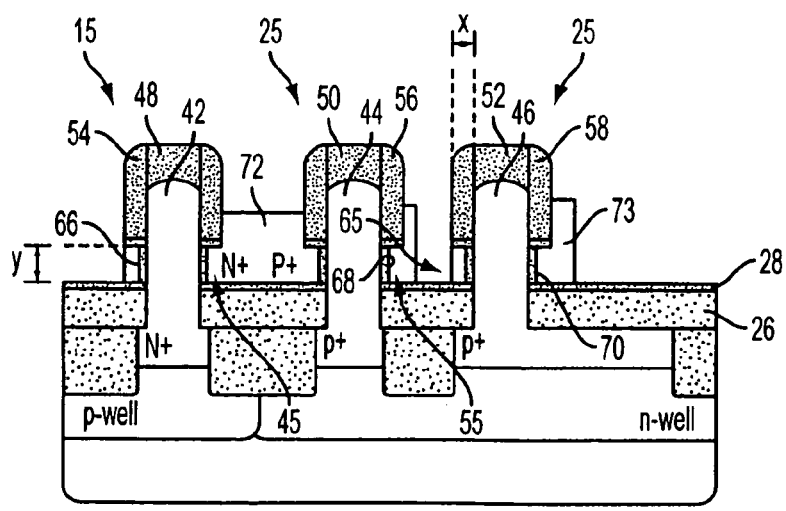
FIG. 12 is a cross-sectional view of the exemplary semiconductor structure at a stage of processing subsequent to that shown in FIGS. 11A-11B.

For example, compare the location of the right portion of the photoresist mask 74 in FIG. 11B relative to the wrap-around-gate 65 as seen in FIG. 12. The photoresist mask 74 in FIG. 11B does not entirely cover the nitride cap 52 or the periphery of the nitride spacer 58. Nevertheless, after etching the polysilicon layer 72 to form the gate interconnect pattern 73, it can be seen in FIG. 12 that the polysilicon under the spacer 58 (on the left side of the pillar 46 as viewed in the drawing) has not been etched away. Because the dry etch used to perform the interconnect patterning process stops on the protective nitride caps 48, 50, 52 and the spacers 54, 56, 58, the polysilicon material covered by the nitride spacer 58 is shielded from being etched away. Accordingly, during formation of the gate interconnect pattern 73, exact alignment of the photoresist mask 74 over the nitride caps 48, 50, 52 and/or over the spacers 54, 56, 58 is not critical to practice the invention.

Figure 13:
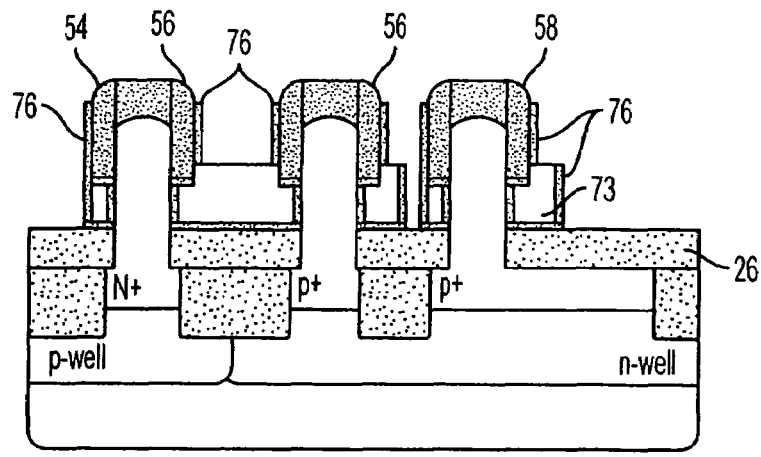
FIG. 13 is a cross-sectional view of the exemplary semiconductor structure at a stage of processing subsequent to that shown in FIG. 12.

FIG. 13 shows an optional process in the inventive method, in which a nitride material is deposited over the transistor structures sufficient to form a thin nitride liner 76 on the vertical surfaces thereof. The nitride material just deposited on the horizontal surfaces of the structural elements formed thus far is removed by dry etching, leaving all previously exposed vertical polysilicon surfaces covered by the thin layer of nitride liner 76. It should be noted that if the nitride liner 28 is still present when the vertical nitride liner 76 is formed, the dry etch used to remove the nitride liner material deposited onto the horizontal surfaces also removes the layer 28.

Figure 14A:
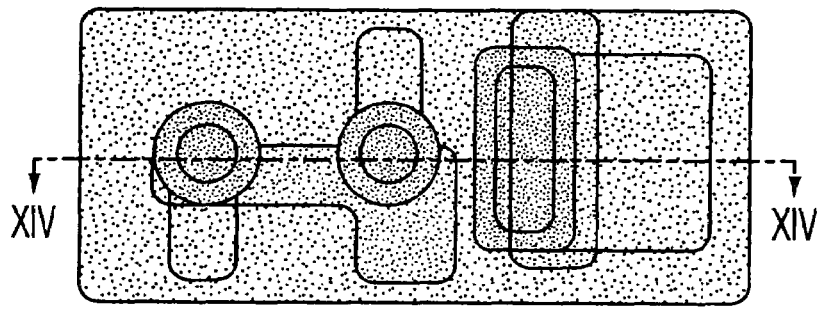
FIG. 14A is a plan view of the exemplary semiconductor structure at a stage of processing subsequent to that shown in FIG. 13.
Figure 14B:
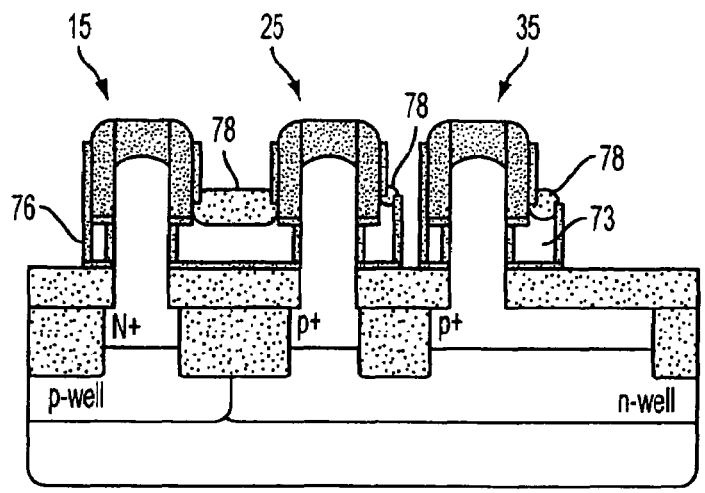
FIG. 14B is a cross-sectional view of the exemplary semiconductor structure through the line XIV-XIV in FIG. 14A.

As shown in FIGS. 14A and 14B, the exposed horizontal surfaces of the polysilicon gate interconnect structure 73 are silicided to reduce the bulk resistance through the gate interconnection structure. To silicide the exposed polysilicon, a layer of the silicide metal is deposited on the polysilicon gate interconnect structure, and then the semiconductor wafer is heated to a sufficiently high temperature until the metal reacts with the polysilicon to produce the silicide 78 on the upper horizontal surfaces of the gate interconnection structure 73. Preferably, the silicide 78 is a cobalt (Co) silicide. However, any metal capable of forming a silicide may be used for this purpose, such as tungsten (W), titanium (Ti), etc.

As mentioned above with reference to FIG. 13, formation of the nitride liner 76 on the vertical surfaces of the wrap-around-gate structure is an optional process. The nitride liner 76 prevents the covered surfaces from silicidation during the process discussed in connection with FIGS. 14A-14B. However, if the silicide 78 can be formed to be thin enough to prevent unwanted bridging of electrical current between adjacent elements, then formation of the nitride liner 76 may be omitted.

Figure 15:
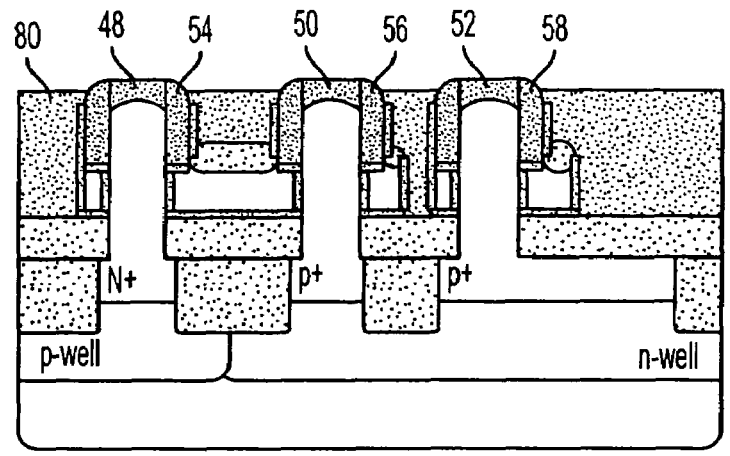
FIG. 15 is a cross-sectional view of the exemplary semiconductor structure at a stage of processing subsequent to that shown in FIGS. 14A-14B.

Following the silicidation process, a thick layer of an insulator material such as HDP oxide, BPSG, etc. is deposited to fill in all the gaps between structural elements formed on the wafer TEOS, (i.e., the vertical transistors 15, 25 and 35 and the gate interconnection structure 73 in this exemplary embodiment) and to cover the same, including the WAG vertical transistors. CMP is then performed to planarize the surface of the insulator 80 and to expose the nitride caps 48, 50, 52 as shown in FIG. 15.

Figure 16A:
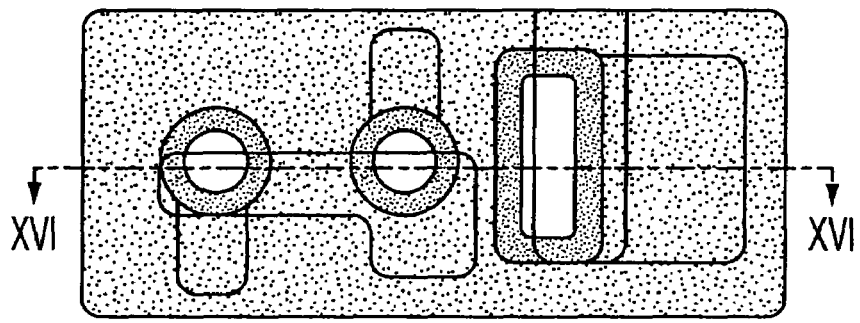
FIG. 16A is a plan view of the exemplary semiconductor structure at a stage of processing subsequent to that shown in FIG. 15.
Figure 16B:
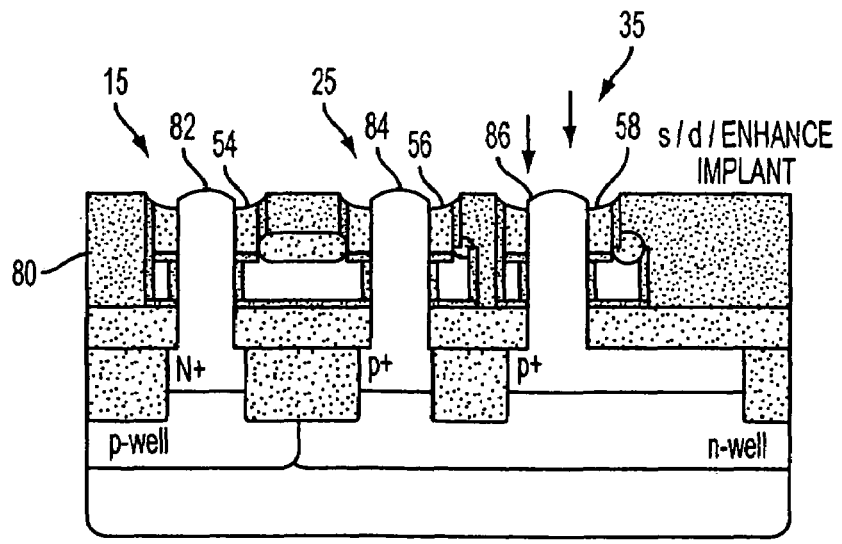
FIG. 16B is a cross-sectional view of the exemplary semiconductor structure through the line XVI-XVI in FIG. 16A.

Referring now to FIGS. 16A-16B, the nitride caps are removed by selective nitride-to-oxide dry etch or wet nitride strip, thereby exposing the top source/drain regions 82, 84, 86 of the respective WAG vertical transistors. If desired, enhancement dopants may be implanted into the top source/drain regions 82, 84, 86 to adjust the threshold voltage ($V_t$) of the respective WAG vertical transistors.

Figure 17:
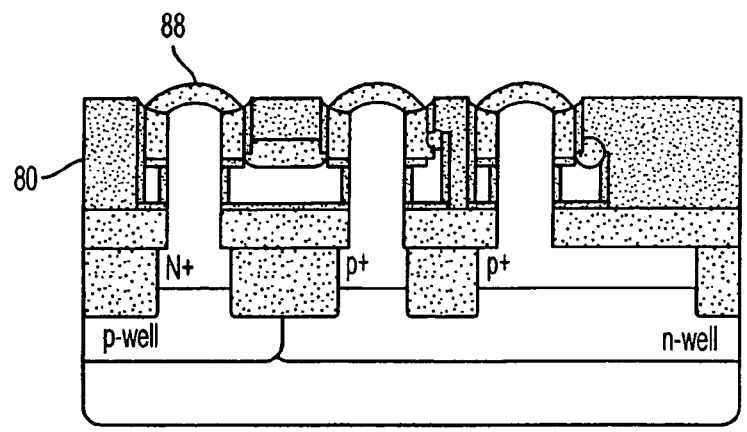
FIG. 17 is a cross-sectional view of the exemplary semiconductor structure at a stage of processing subsequent to that shown in FIGS. 16A-16B.

As illustrated in FIG. 17, the exposed top source/drain regions 82, 84, 86 may be silicided, preferably with a cobalt silicide (Co—$Si_x$). Although this is not a necessary process of the invention and may be omitted if desired, formation of the silicide serves to lower contact resistance at the source/drain regions and to provide a self-aligned etch stop for subsequent photoresist and etch processing. Similar to the silicide 78 described above, other silicide metals such as Ti or W may be used instead of Co.

The interconnected wrap-around-gate structure 73 is integrated with other circuit elements in the semiconductor wafer by forming conductive contact plugs to the source/drain of the WAG vertical transistors 15, 25, 35. When starting from a wafer with the top source/drain region of the vertical transistors exposed, as is the case with the semiconductor structure shown in FIGS. 16B and 17, it is preferable to provide a layer of insulator material over the top source/drain regions as a medium in which the contact plugs can be defined. Hence, an insulator layer 90 at least about 500 Å-1000 Å thick is deposited over the vertical transistors 15, 25, 35 as can be seen in FIG. 18B. Preferably, the insulator material is TEOS, but may be another suitable insulator material.

Figure 18A:
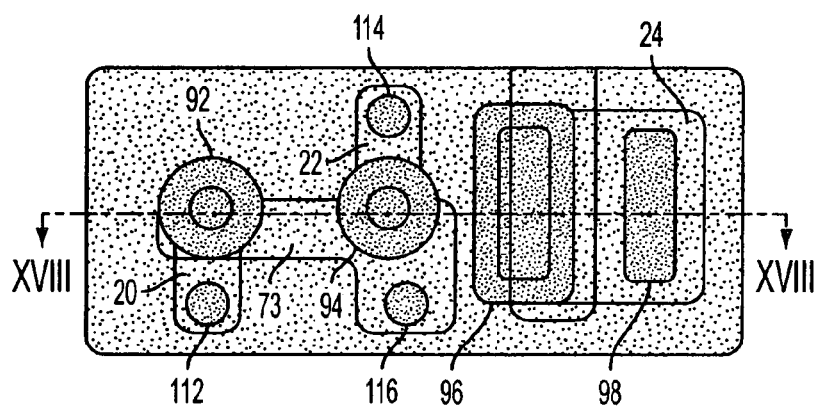
FIG. 18A is a plan view of the exemplary semiconductor structure at a stage of processing subsequent to that shown in FIG. 17.
Figure 18B:
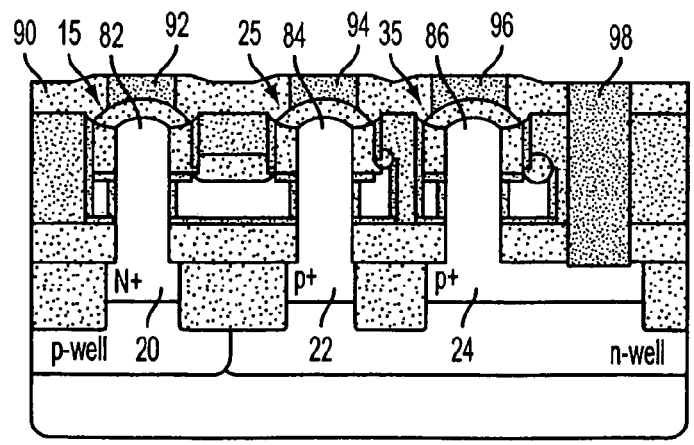
FIG. 18B is a cross-sectional view of the exemplary semiconductor structure through the line XVIII-XVIII in FIG. 18A.

Interconnect contact holes are then patterned in the insulator layer 90 so as to be aligned with and extend through the semiconductor structure as necessary to provide access to the bottom source/drain regions and the top source/drain regions of each transistor 15, 25, 35 and the gate interconnect structure 73 (see FIG. 18A). Each contact hole is lined with a barrier layer deposited by conventional methods. Any of a number of materials may be suitable for use as a barrier layer, such as Ti, TiN, as long as the material is conductive and also effective to prevent migration of metal ions from the contact plug into the respective transistor element to which the contact hole extends. After depositing the barrier layers in the respective contact holes, contact plugs are formed in each of the holes by depositing an appropriate contact metal, such as tungsten (W).

The number and placement of the contact plugs can best be understood with specific reference to the elements shown in FIGS. 18A and 18B. In this example, contact plugs 92, 94, 96 connect to the top source/drain regions 82, 84, 86, respectively, of the WAG vertical transistors 15, 25, 35. Similarly, contact plugs 112, 114, 98 connect to the bottom source/drain regions 20, 22, 24, respectively. Lastly, contact plug 116 connects to the gate interconnect structure 73.

Figure 19A:
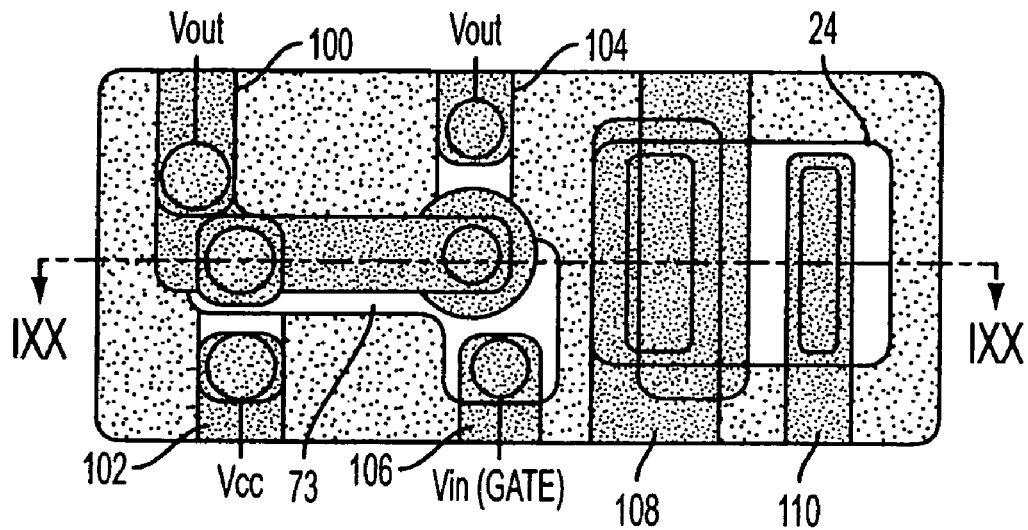
FIG. 19A is a plan view of the exemplary semiconductor structure at a stage of processing subsequent to that shown in FIGS. 18A-18B.
Figure 19B:
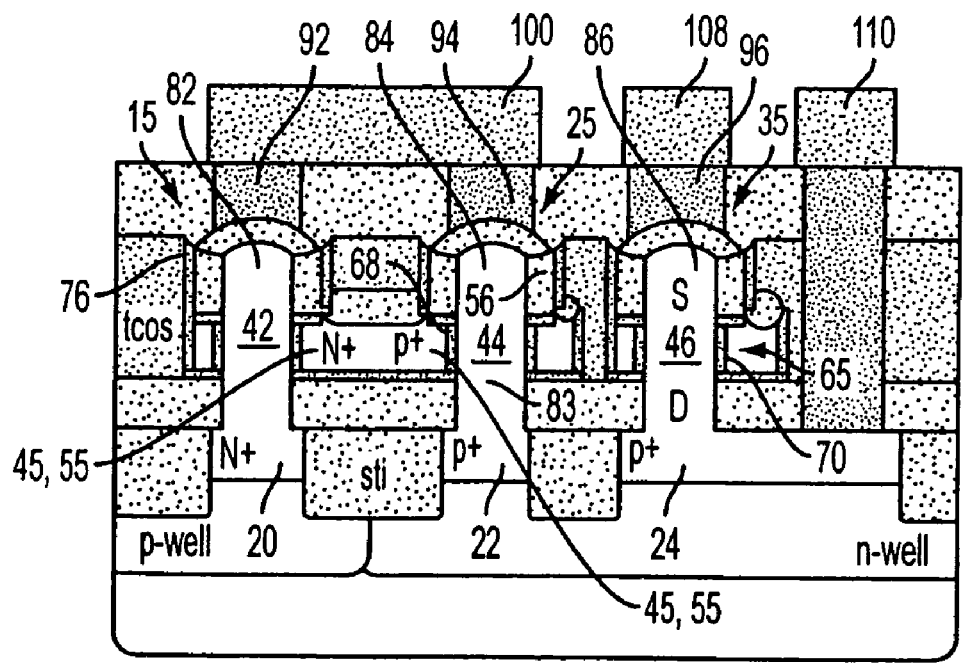
FIG. 19B is a cross-sectional view of the exemplary semiconductor structure through the line IXX-IXX in FIG. 19A.

After establishing the contact plugs to the various elements of the WAG vertical transistors 15, 25, 35, the top ends of the contact plugs are interconnected to provide the input and output paths that will carry electrical current for operating the transistors 15, 25, 35. FIGS. 19A-19B illustrate an example of such an interconnection pattern, in which metal lines 102 and 104 separately connect voltage sources $V_{cc}$ and $V_{ss}$ to the bottom source/drain regions 22, 24, respectively, of the first two WAG vertical transistors 15, 25, while metal line 106 connects an input voltage $V_{in}$ to the gate interconnect pattern 73. Another metal line 100 connects the top source/drain regions 22, 24 and outputs signals therefrom as a voltage $V_{out}$ to other (undisclosed) elements in the semiconductor circuit. Metal line 108 connects to the source region 86 of the third vertical transistor 35 to another element in the semiconductor structure which is not shown in the figures, and metal line 110 also connects the drain region 24 of the vertical transistor 35 to another element in the semiconductor circuit.

The semiconductor structure produced according to the process described above thus incorporates a wrap-around-gate according to the invention. Specifically, referring to FIG. 12 as an example, a wrap-around-gate 45 according to the invention includes a conductive gate material 72 surrounding a polysilicon pillar 42, and a gate dielectric layer 66 sandwiched between the conductive gate material 72 and the polysilicon pillar 42 (the pillars being the "core" of the transistor 45). The upper portion of the polysilicon core has a spacer layer 54 formed on the sidewalls thereof surrounding the same, and the gate dielectric 66 and the gate material 72 surround a portion of the polysilicon core directly below the portion surrounded by the sidewall spacer layer 54. The thickness of the wrap-around-gate 45 is defined by the thickness "x" of the spacer layer 54, so that the gate dielectric layer 66 and the conductive gate material 72 surrounding the polysilicon pillar 42 have a combined thickness substantially corresponding to the thickness of the sidewall spacers.

The invention further encompasses a vertical transistor that includes the wrap-around-gate described above. Referring now to FIGS. 19A and 19B as an example, a vertical transistor 25 according to the invention includes a wrap-around-gate 55 covering a gate dielectric layer 68, both of which surround a polysilicon pillar 44. The polysilicon pillar is the "core", with the gate dielectric layer 68 and the wrap-around-gate 55 surrounding a middle portion of the pillar 44. A first source/drain region 22 of the vertical transistor 25 is defined in the bottom portion of the pillar 44, formed below the level on the wafer at which the wrap-around-gate 55 and the gate dielectric 68 are formed. A second source/drain region 84 of the vertical transistor 25 is defined in the top portion of the pillar 44, which extends above the wrap-around-gate 55 and gate dielectric layer 68. The top portion of the pillar 44 is surrounded by a nitride spacer 56, which defines the thickness of the wrap-around-gate 55, as mentioned above.

The channel region 83 for the vertical transistor 25 is formed in the central portion of the pillar 44, which is surrounded by the gate dielectric layer 68 and the wrap-around-gate 55. The bottom portion of the pillar 44 forming the bottom source/drain region 22 is adjacent to the channel region 83, and the top portion of the pillar 44 forming the top source/drain region 84 is also adjacent to the channel region 83.

A gate interconnect structure 73 is unitarily formed with the wrap-around-gate 55 for providing a connection path for a gate activation voltage $V_{in}$. In the example shown in FIGS. 19A-19B, the voltage source of the gate activation voltage $V_{in}$ is connected to the wrap-around-gate 55 along a conductive path that includes a contact plug 116 (see FIG. 18A), a conductive line 106 and the gate interconnect structure 73. Here, the bottom source/drain region 22 functions as the source and the top source/drain region 84 functions as the drain for the WAG vertical transistor 25. However, depending on the circuit arrangement incorporating the WAG vertical transistor disclosed herein, the source and drain regions may be reversed so that the source is at the top and the drain is at the bottom of the WAG vertical transistor (such as the case with the vertical transistor 35 seen in FIG. 19B).

According to the circuit arrangement in FIGS. 19A-19B, a voltage source $V_{ss}$ is connected to the source region 22 of the vertical transistor 25 via a conductive path having a conductive line 104 connecting to a contact plug 114 (see FIG. 18A), which in turn contacts the source region 22 at the bottom portion of the pillar 44. Similarly, signals are output from the vertical transistor 25 via a conductive path defined by a conductive plug 94 provided in contact with the drain region 84, which is connected to a conductive line 100.

In addition to forming part of the conductive path between a voltage source $V_{in}$ and a wrap-around-gate 55, the gate interconnect structure 73 may connect the wrap-around-gate 55 to other transistor gates, whereby voltage provided from a single source ($V_{in}$) can be used to activate all the transistor gates formed along the gate interconnect structure. This gate interconnect feature can be used as a transmission line for simultaneously controlling a number of elements connected along the transmission line, or as "built-in" address lines for use in conjunction with additional and intersecting address lines for accessing selected address locations in a semiconductor-based array. As an example of the latter, the gate interconnect structure may be used as a word (or bit) line in the context of a memory array, as will become apparent below.

Other advantages of the invention include the scalability of the WAG vertical transistor and the fact that the minimum size of the structural features of the transistor are limited only by film thicknesses achieve by controlling the diffusion deposition of the relevant materials, and not by the physical limitations of photolithography. Specifically, the widths of the source, drain and gate regions of a WAG vertical transistor formed according to the invention can be scaled by controlling the growth height of the epitaxial polysilicon pillars and the deposition thicknesses of the insulator layers used to define the width of the wrap-around-gate and the width of the source and drain regions. Similarly, the thickness of the wrap-around-gate can be controlled by depositing a spacer layer around and along the sidewalls of the epitaxial pillar. The thicknesses of the insulator layers and spacer layer can be built up in molecularly-sized increments by controlling the diffusion of the deposited material onto the semiconductor structure.

The only feature of the invention which is formed using photolithography is the holes formed through the insulator layers through which the epitaxial pillars are grown. Thus, the minimum size of those holes is initially limited by the physical constraints of photolithography. However, like the other critical dimensions mentioned above, the diameter of the pillars can be reduced from the photolithographic minimum by depositing spacers along the sidewalls of the holes, wherein the desired thickness of the spacers deposited can be easily established by controlling the diffusion of the spacer material.

Another significant aspect of the invention is that using the various insulator and spacer layers to guide the construction of the WAG vertical transistor effectuates self-alignment and self-definition of the transistor elements and dimensions. In particular, the source, drain and channel regions of the vertical transistor are automatically defined along the pillar by the thicknesses of the three insulator layers through which the pillar is formed. Also, using the films to define the source, drain and channel regions also automatically aligns the transistor gate around the channel region. Furthermore, the thickness of the gate is automatically defined by the thickness of the spacer layer surrounding the upper portion of the pillar. Self-aligning and self-defining the transistor elements as it is being formed contributes to minimizing the number of features which require patterning to align and define the same.

Many conventional semiconductor circuits must be formed on an SOI wafer to prevent the problem of signal leakage through the substrate. With the present invention, electrical signals travel across the WAG vertical transistor via the epitaxial pillar grown vertically from the polysilicon substrate and hence perpendicularly to the substrate. As such, the invention does not necessarily require an SOI wafer as its substrate, although this will depend on the circuit being constructed on the semiconductor substrate.

For at least the reasons explained herein, the WAG vertical transistor and the method for fabricating the WAG vertical transistor are desirable. The relative ease of manufacture and the broad scalability of the WAG vertical transistor enables the invention to be readily integrated into increasingly high density semiconductor circuits as popular demand rises for electronic products to be made smaller and smaller, yet ever more powerful.

An important aspect of the invention is therefore the ability to control the critical dimensions of the WAG vertical transistor during formation thereof by depositing relevant film and spacer layers to the appropriate thicknesses. Since film thickness is determined by controlling the diffusion of the film material on the relevant semiconductor structure, the transistor dimensions may be formed to be as small as a few hundred angstroms, if desired. Thus, this process and the transistor formed thereby is well suited for very small scale and/or dense semiconductor circuits.

In light of these characteristics of the invention, it can be seen that the WAG vertical transistor according to the invention is particularly simple to construct and is readily scalable for very high density semiconductor structures, without being limited by the physical constraints and high production costs associated with photolithography.

It is evident from the foregoing disclosure that the wrap-around-gate, WAG vertical transistor and method of producing the wrap-around-gate and WAG vertical transistor according to the present invention may be used in the fabrication of many different semiconductor circuit arrangements. A particularly useful application of the invention is in the production of a semiconductor memory device used in microprocessor systems and other computerized devices. There are many different types of memory devices which may be incorporated into a microprocessor system, including DRAM, SRAM, SDRAM, and flash memory, to name just a few. The present invention may be used in connection with any type of semiconductor memory device which includes MOSFET transistors.

Generally, semiconductor memory devices are comprised of two basic elements: memory storage areas and memory control areas. Memory storage areas typically include an array of memory cells, while the memory control area includes circuitry for controlling the operation of the memory cell array. For ease of explanation, an exemplary use of the present invention in a memory device is described with reference to a DRAM array, although it should be understood that the invention may also be incorporated in any other type of semiconductor memory device that includes MOSFET transistors.

Figure 42:
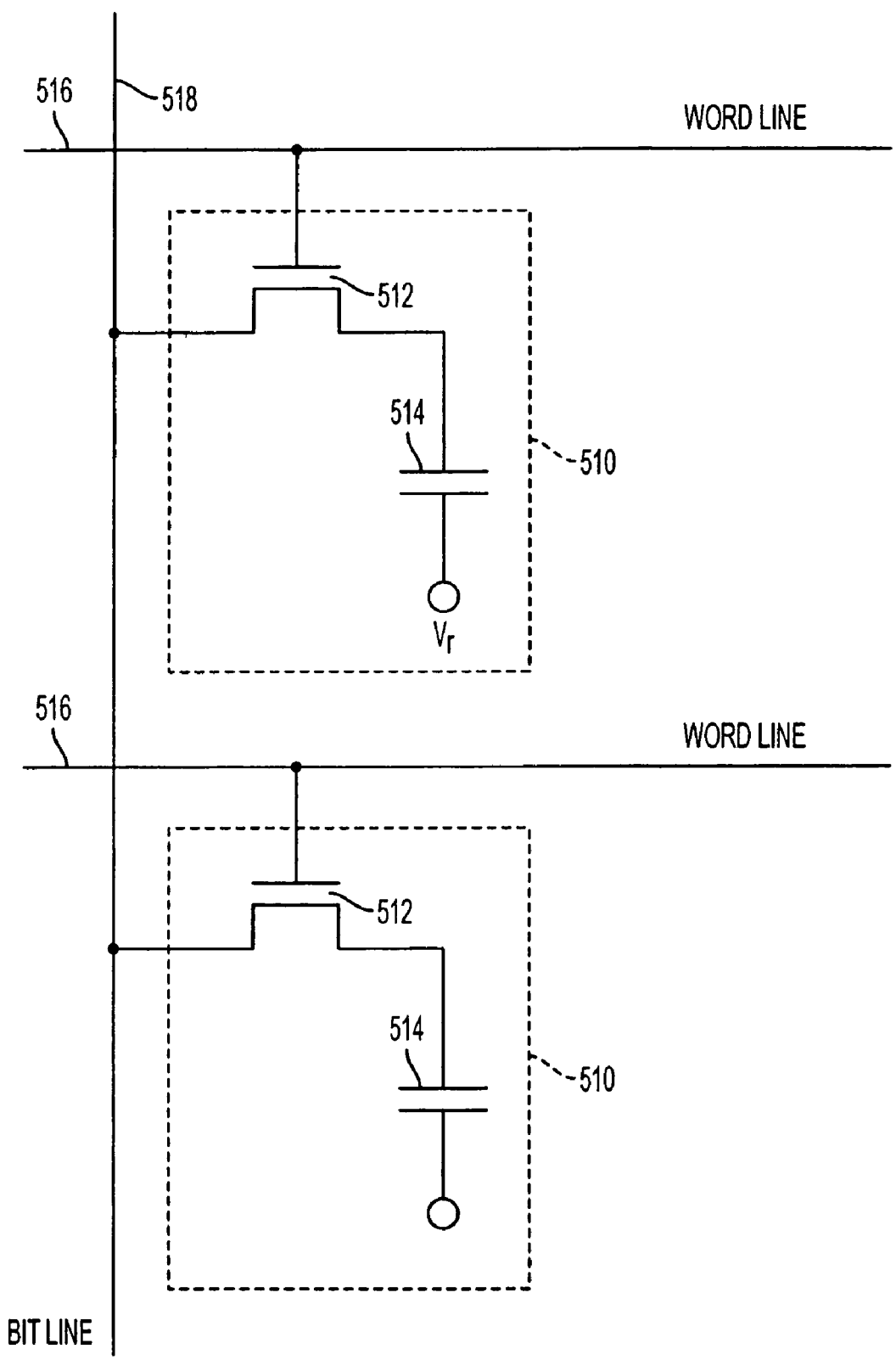
FIG. 42 is a circuit diagram of a portion of a conventional DRAM array.

FIG. 42 illustrates a portion of a DRAM memory circuit containing two neighboring DRAM cells 510. For each cell 510, one side of a storage capacitor 514 is connected to a reference voltage, which is typically one half of the internal operating voltage (i.e., the voltage corresponding to a logical "1") of the circuit. The other side of the storage capacitor 514 is connected to the drain of an access field effect transistor 512. The gate of the access field effect transistor 512 is connected to a voltage input line referred to as the word line 511. The source of the field effect transistor 512 is connected to a voltage input line referred to as the bit line 518. With the circuit connected in this manner, it is apparent that the word line 511 controls access to the storage capacitor 514 by allowing or preventing the signal (a logic "0" or a logic "1") on the bit line 518 to be written to or read from the storage capacitor 514.

Capacitors for a DRAM cell may be arranged in several ways relative to the corresponding access transistor in the cell. Typical designs for DRAM capacitors include planar capacitors, trench capacitors and stacked capacitors. Planar capacitors are formed laterally to the associated access transistor in a DRAM cell, while trench capacitors are formed in the wafer substrate beneath the associated access transistor in a semiconductor device. Stacked capacitors, on the other hand, are stacked, or placed, over the access transistor. For reasons including ease of fabrication and increased capacitance, most manufacturers of DRAMs larger than 4 Megabits use stacked capacitors.

In light of the advantages offered by stacked capacitors over trench capacitors, the following description of a method for fabricating a DRAM array will be discussed in connection with stacked capacitors, but it should be understood that the invention is not limited to having stacked capacitors. For example, use of the invention in connection with trench capacitor or planar capacitor DRAMs is also possible.

One widely used type of stacked capacitor is known as a container capacitor. Known container capacitors are in the shape of an upstanding tube having an oval or circular cross section. The tube is defined by two "plates" of conductive material such as doped polycrystalline silicon separated by a dielectric layer. The bottom end of the tube is closed, and the exterior surface of the bottom end is in contact with either the drain of the access transistor or a plug which itself is in contact with the drain. The other end of the tube is open (the tube is filled with an insulative material later in the fabrication process). The sidewall and closed end of the tube form a container; hence the name "container capacitor."

A container capacitor may be formed as a single-sided container cell or as a double-sided container cell. In a single-sided container cell, the tube is defined by one cell "plate" while the interior of the tube is filled by a second cell "plate." The first and second cell "plates" are separated by the aforementioned dielectric layer, and the exterior of the container cell is surrounded by an insulator material (see FIGS. 40A-40B and 41). In a double-sided container cell, on the other hand, the second cell "plate" fills the interior of the closed-end first cell plate tube and also surrounds the exterior of the tube (see FIGS. 38A-38B). Although the invention is further discussed in connection with stacked container capacitors, the invention should not be limited thereto.

With an understanding as to the broad applicability of the present invention, a process for fabricating an exemplary DRAM array is now described with reference to FIGS. 20-41, wherein duplicative elements in these drawings are indicated by the same reference numeral for each distinct element.

Figure 20:
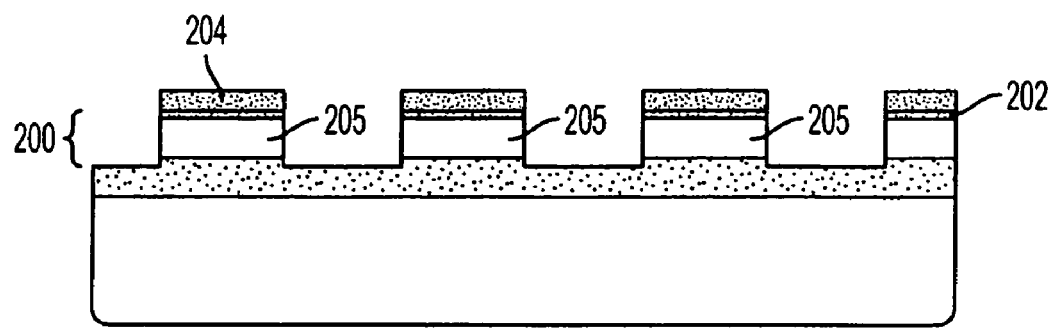
FIG. 20 is a cross-sectional view of an exemplary DRAM array constructed in accordance with an embodiment of the invention, shown at an intermediate stage of processing.

The process for making a DRAM array using the present invention begins with an SOI substrate having a planarized surface. Referring to FIG. 20, an oxide layer 202 is grown or deposited on a silicon Si layer 200, and a sacrificial nitride layer 204 is formed over the oxide layer 202. The resulting structure is patterned and etched to remove strips of the silicon layer 200 to form alternating raised and recessed rows, as seen in FIG. 20. The remaining strips of silicon 205 from the Si layer 200 will become the digit (bit) lines for the memory array. For this reason, an SOI wafer is used as the substrate to prevent signal leakage and coupling of cells between adjacent bit lines.

Preferably, a silicide layer is formed on the sidewalls of the polysilicon digit lines by depositing a silicide metal such as Cobalt or Tungsten on the exposed polysilicon surfaces and performing an annealing process to form the silicide. Although this process is not necessary, silicidation lowers the electrical resistance of the digit lines and hence improves the operational efficiency of the memory system.

Figure 21:
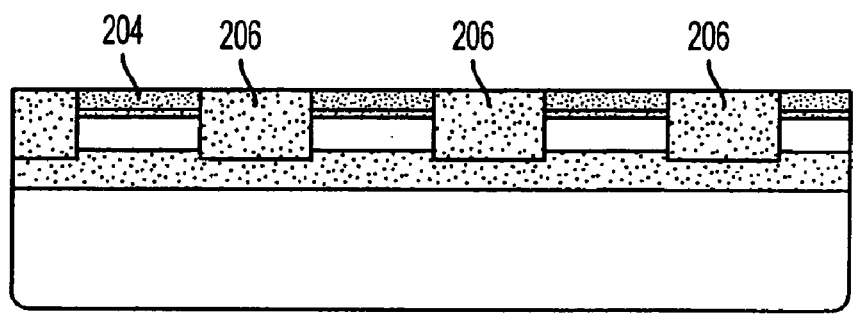
FIG. 21 is a cross-sectional view of the exemplary DRAM array at a stage of processing subsequent to that shown in FIG. 20.
Figure 22:
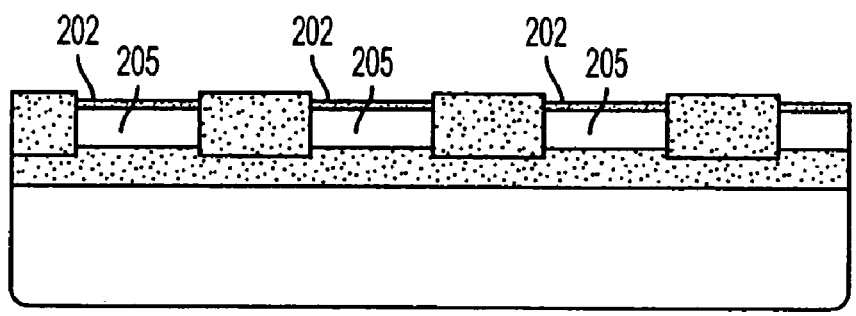
FIG. 22 is a cross-sectional view of the exemplary DRAM array at a stage of processing subsequent to that shown in FIG. 21.

Next, an insulator material is deposited over the wafer to fill in the recessed rows, and CMP is performed to remove any of the deposited insulator material until the surfaces of the sacrificial nitride layer 204 and the insulator material are planar (see FIG. 21). The sacrificial nitride layer 204 is removed by wet nitride strip, leaving the structure shown in FIG. 22. Optionally, the oxide layer 202 may also be removed.

Figure 23:
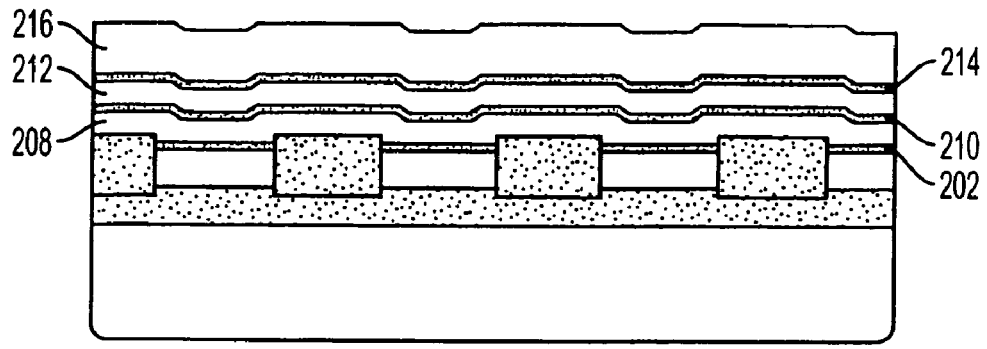
FIG. 23 is a cross-sectional view of the exemplary DRAM array at a stage of processing subsequent to that shown in FIG. 22.
Figure 24:
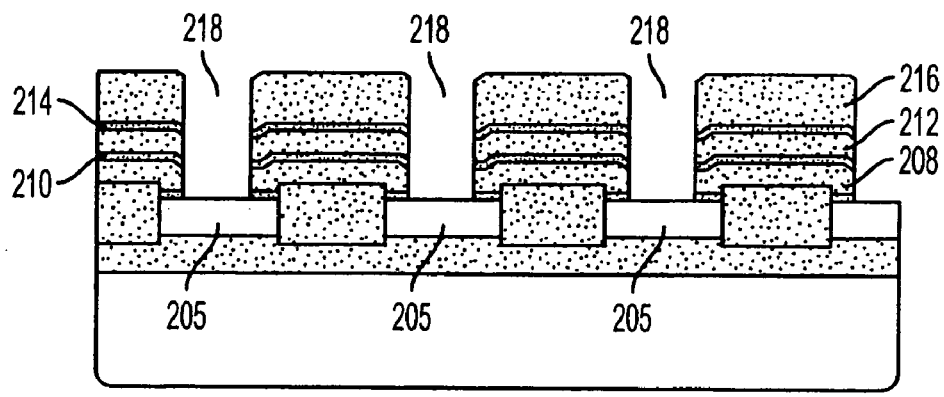
FIG. 24 is a cross-sectional view of the exemplary DRAM array at a stage of processing subsequent to that shown in FIG. 23.
Figure 25:
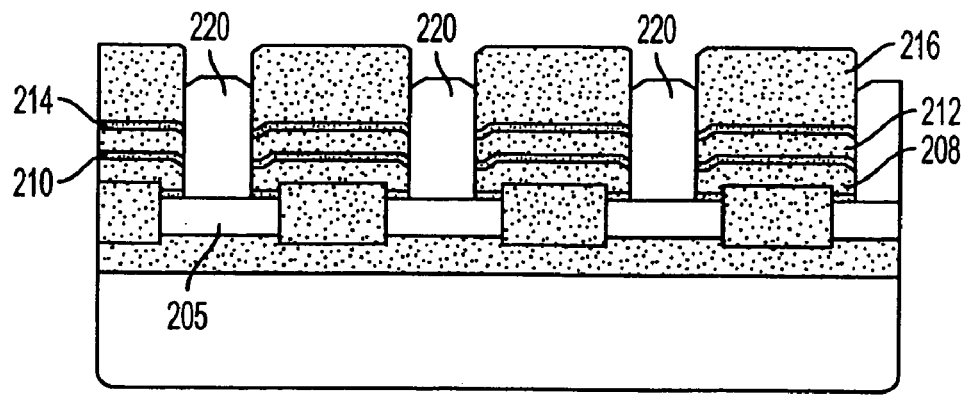
FIG. 25 is a cross-sectional view of the exemplary DRAM array at a stage of processing subsequent to that shown in FIG. 24.

After preparing the wafer in this manner, three layers of an insulator material 208, 212, 216, which may be TEOS, BPSG or any other suitable material, and two layers of a nitride liner 210, 214 are deposited on the wafer in alternating fashion, as depicted in FIG. 23. Referring now to FIGS. 24-25, the wafer is patterned and etched to form holes 218 through the insulator and nitride liner layers 208, 212, 216, 210, 214 to expose the digit lines 205, and a silicon pillar 220 is epitaxially grown from the silicon digit lines 205 in each of the holes 218. The pillars 220 may be either grown to or etched back to about 500 Å to about 1000 Å below the surface level of the insulator layer 216.

Figure 26:
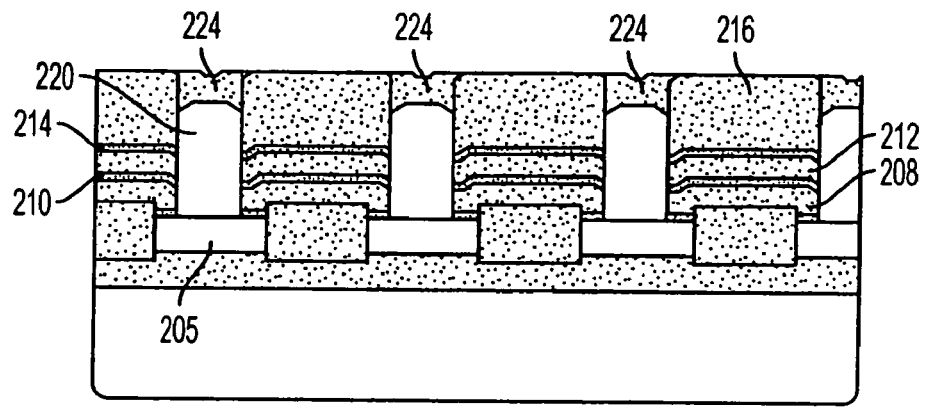
FIG. 26 is a cross-sectional view of the exemplary DRAM array at a stage of processing subsequent to that shown in FIG. 25.
Figure 27:
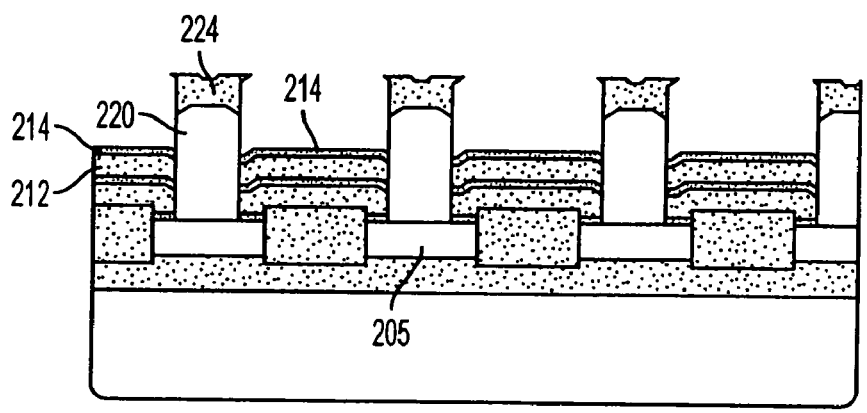
FIG. 27 is a cross-sectional view of the exemplary DRAM array at a stage of processing subsequent to that shown in FIG. 26.
Figure 28:
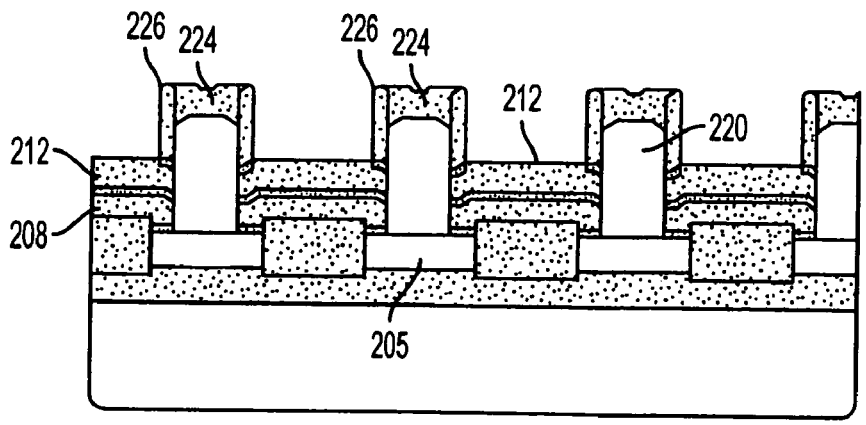
FIG. 28 is a cross-sectional view of the exemplary DRAM array at a stage of processing subsequent to that shown in FIG. 27.

Nitride caps 224 are formed on each pillar 220 to fill in the remaining space in each hole 218, and then planarized with the insulator layer 216 if necessary (see FIG. 26). After formation of the nitride caps 224, the insulator layer 216 is removed by a wet etch process, as illustrated in FIG. 27.

Removal of the insulator layer 216 exposes the side surfaces of the pillars 220 above the level of the nitride liner 214. A layer of nitride is deposited to form spacers 226 on the exposed side surfaces of the pillars 220 and nitride caps 224. Thereafter, any nitride deposited on the horizontal surfaces of the wafer structures is removed by dry etching, including the nitride liner 214, resulting in the structure seen in FIG. 28.

Figure 29:
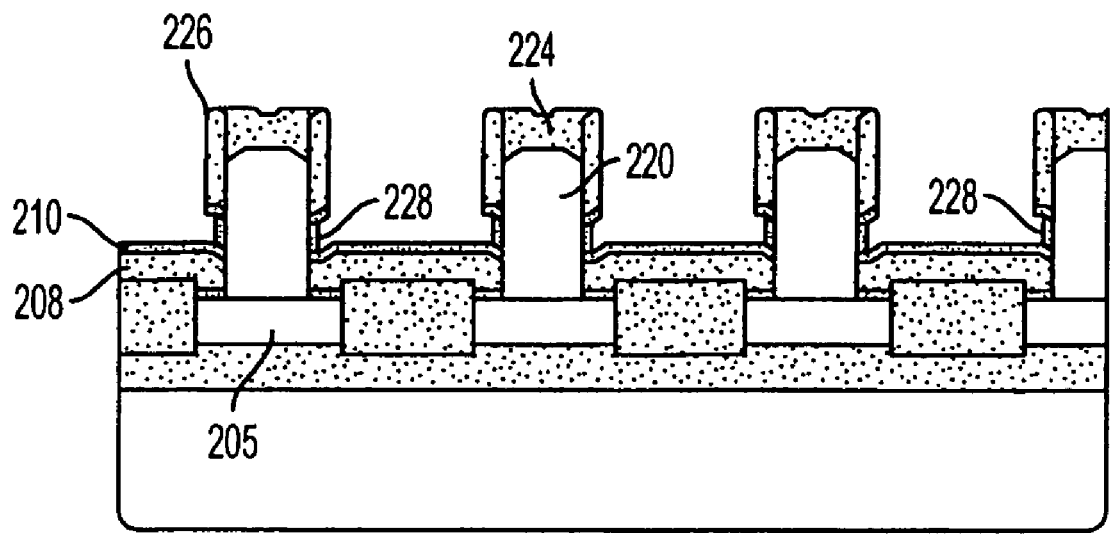
FIG. 29 is a cross-sectional view of the exemplary DRAM array at a stage of processing subsequent to that shown in FIG. 28.
Figure 30:
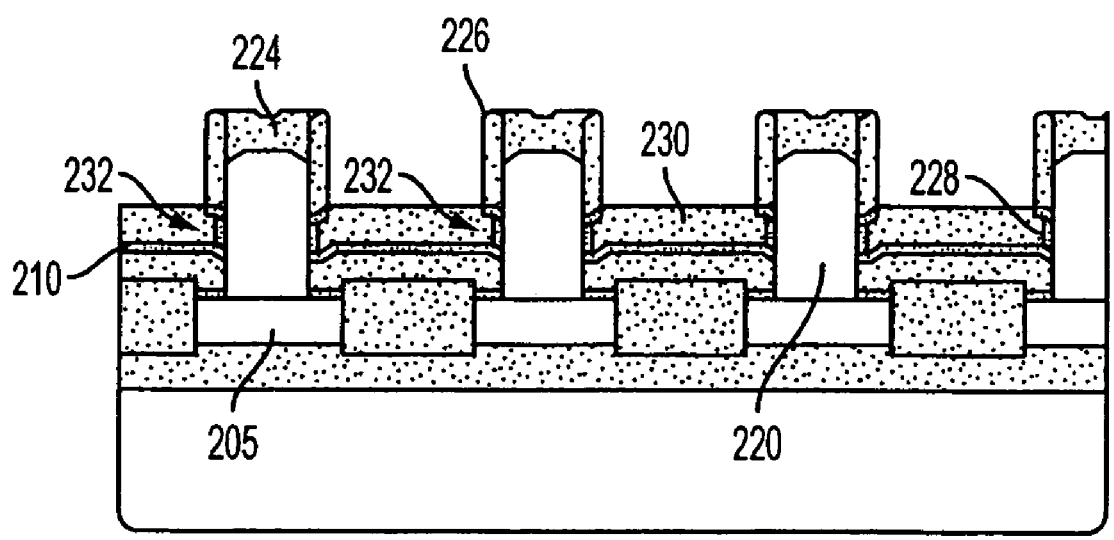
FIG. 30 is a cross-sectional view of the exemplary DRAM array at a stage of processing subsequent to that shown in FIG. 29.

Insulator layer 212 is also removed by a further etch process, e.g., a wet etch, to remove the insulator layer 212 to thereby expose another side surface portion of the pillars 220. The wrap-around-gate structures are formed on and surrounding the pillars 220 at the now exposed surfaces thereof by growing or depositing a gate dielectric layer 228 onto the exposed pillar surfaces, as illustrated in FIG. 29, and then blanket depositing a layer of conductive material 230 to cover the nitride liner 210 approximately to the level at the bottom of the nitride spacers 226 (FIG. 30). The wrap-around-gates 232 are defined by the deposition of the conductive material 230 around the pillars 220 (and the gate dielectric layer 228 formed on the pillar surfaces). Conductive material 230 may be a metal or polysilicon, as discussed above with reference to FIGS. 10A-10B. If the conductive material 230 is polysilicon, n+ and p+ implantation may be performed at this stage.

Figure 31A:
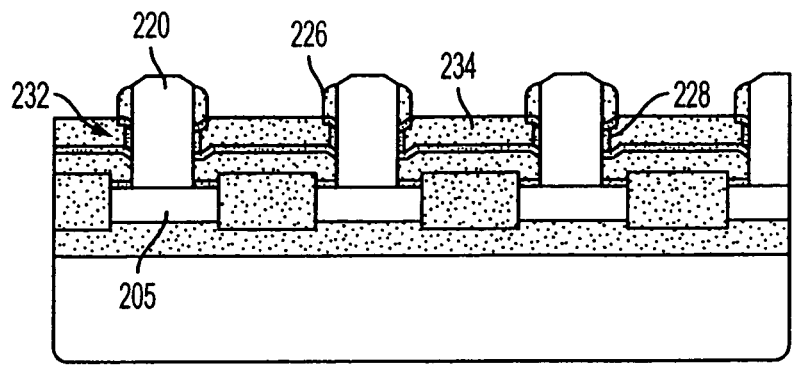
FIG. 31A is a cross-sectional view along an X direction of the exemplary DRAM array at a stage of processing subsequent to that shown in FIG. 30 and taken through the line A-A in FIG. 31C.
Figure 31B:
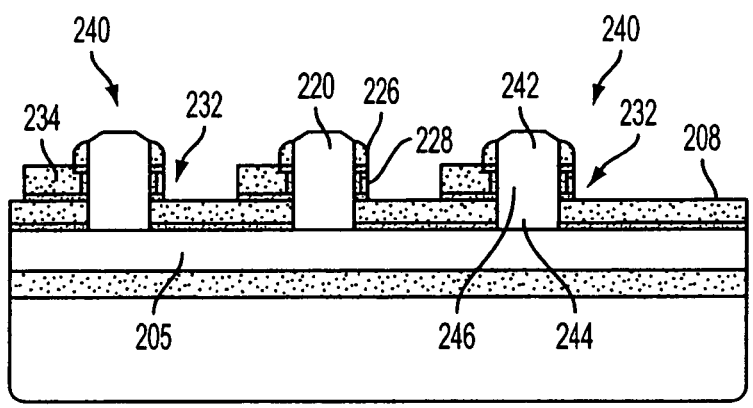
FIG. 31B is a cross-sectional view along a Y direction of the exemplary DRAM array at the stage of processing shown in FIG. 31A and taken through the line B-B in FIG. 31C.
Figure 31C:
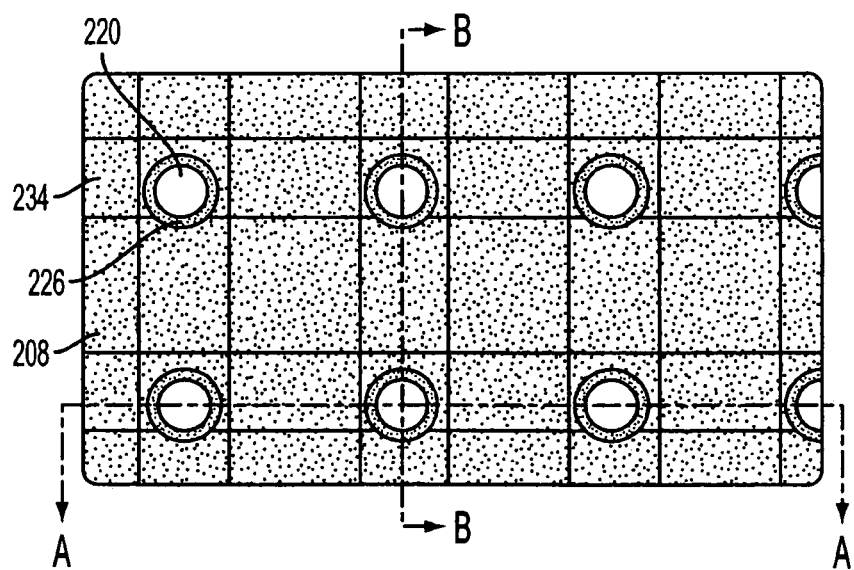
FIG. 31C is a plan view of the exemplary DRAM array at the stage of processing shown in FIGS. 31A-31B.

Referring now to FIGS. 31A-31C, the layer of conductive material 230 is patterned and etched to form WAG interconnect patterns 234, and then the nitride caps 224 are removed by selective nitride etching, which also removes the portions of the nitride liner 210 exposed by the etching formation of the WAG interconnect patterns 234. If the conductive material is polysilicon, the WAG interconnect patterns may be silicided, if desired, as disclosed above with reference to FIGS. 14A-14B.

The self-aligning characteristic of the invention is demonstrated by comparison of the overhead view of the memory array as formed thus far, as illustrated in FIG. 31C, with the cross-sectional view thereof illustrated in FIG. 31B. As seen in FIG. 31C, the gate interconnect patterns 234 "cut through" the nitride spacers 226. Yet as seen in FIG. 31B, the wrap-around-gate 232 still surrounds the pillars 220, since the nitride spacers 226 had protected the portion of conductive material 230 underneath the spacers from being etched away during formation of the WAG interconnect patterns 234. Thus, each wrap-around-gate is self-defined to include a layer of conductive material 230 surrounding one of the pillars 220, wherein the layer has a thickness corresponding to that of the nitride spacer 226 surrounding the respective pillar 220.

At this point, the formation of the WAG vertical transistors 240 in the memory array is thus essentially complete. Each WAG vertical transistor 240 includes a wrap-around-gate 232 surrounding a gate dielectric layer 228, which in turn surrounds a channel region 244 in an epitaxially formed pillar 220. For each WAG vertical transistor 240, the top source/drain region 242 and the bottom source/drain region 244 are also defined in the respective pillar 220, with the bottom source/drain region 244 connecting directly to a buried digit line 205.

Figure 32A:
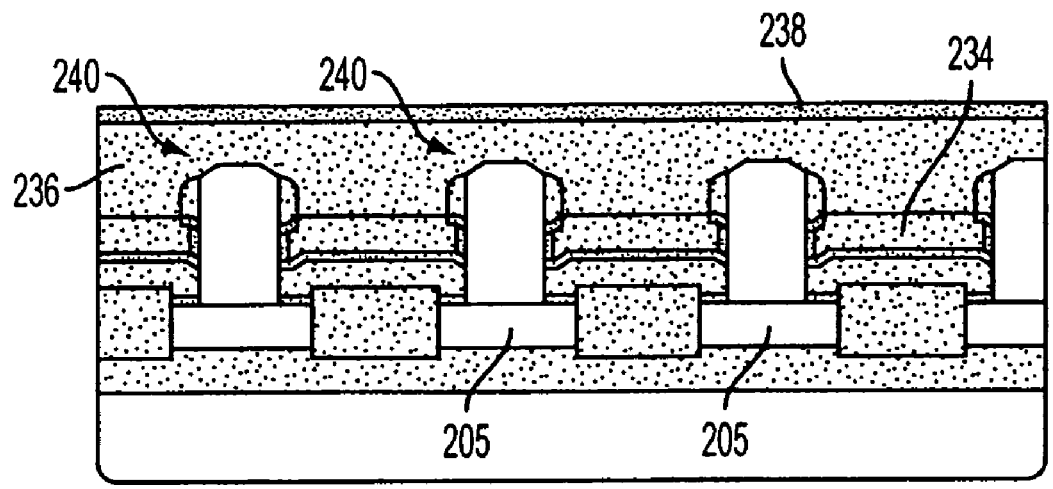
FIG. 32A is a cross-sectional view along an X direction of the exemplary DRAM array at a stage of processing subsequent to that shown in FIGS. 31A-31C.
Figure 32B:
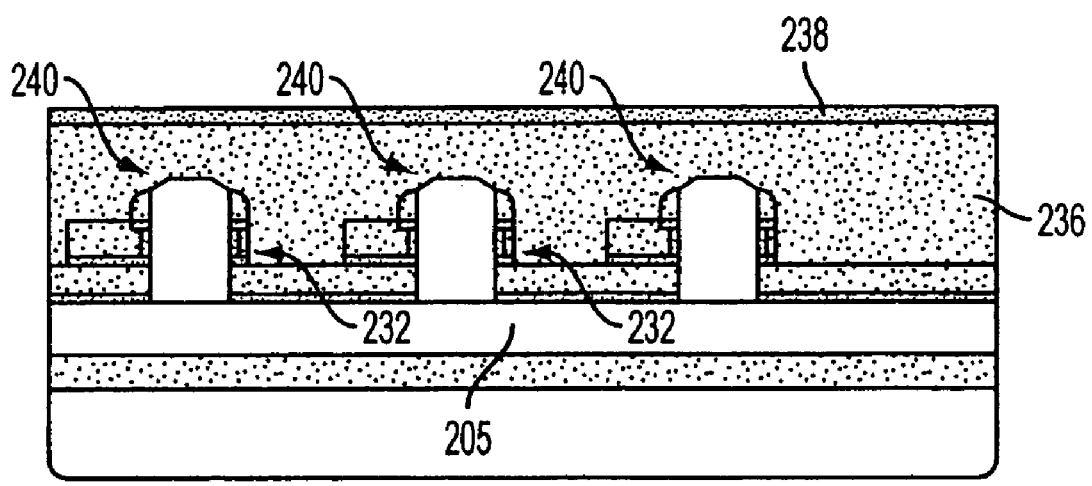
FIG. 32B is a cross-sectional view along a Y direction of the exemplary DRAM array at the stage of processing shown in FIG. 32A.

To prepare for further processing to form the exemplary DRAM array, a layer of an insulator material 236, such as BPSG or TEOS, for example, is blanket deposited to cover the WAG vertical transistors 240 (FIGS. 32A-32B). As mentioned previously, the exemplary DRAM array fabricated according to the present invention includes a stacked container capacitor in each DRAM cell. If the container capacitor to be formed is a double-sided container, a layer of a nitride liner 238 is deposited over the insulator material 236 to serve as an etch stop layer at a later stage of processing. On the other hand, if the container capacitor is to be a single-sided container, the nitride liner 238 shown in FIGS. 32A-32B may be omitted.

All of the process variations, layer thicknesses, materials and other details and options described above with reference to FIGS. 2-16B are also applicable to the formation of wrap-around-gates 232 and vertical transistors 240 for a memory array. It is further noted that the order in which the processes are performed are not necessarily limited to the order discussed hereinabove. The order in which the processes disclosed herein are performed may be varied to the extent that such variation(s) do not prevent or hinder the ultimate formation of the wrap-around-gates and WAG vertical transistors according to the invention. For example, after deposition of the conductive layer 230 in FIG. 30, the nitride caps 224 may be removed prior to forming the WAG interconnection patterns 234 as long as the surfaces of the pillars 220 exposed by removal of the nitride caps 224 are protected by the photoresist mask used for etching the WAG interconnect patterns 234 or other means to protect the pillars 220 from being etched during this stage.

Figure 33A:
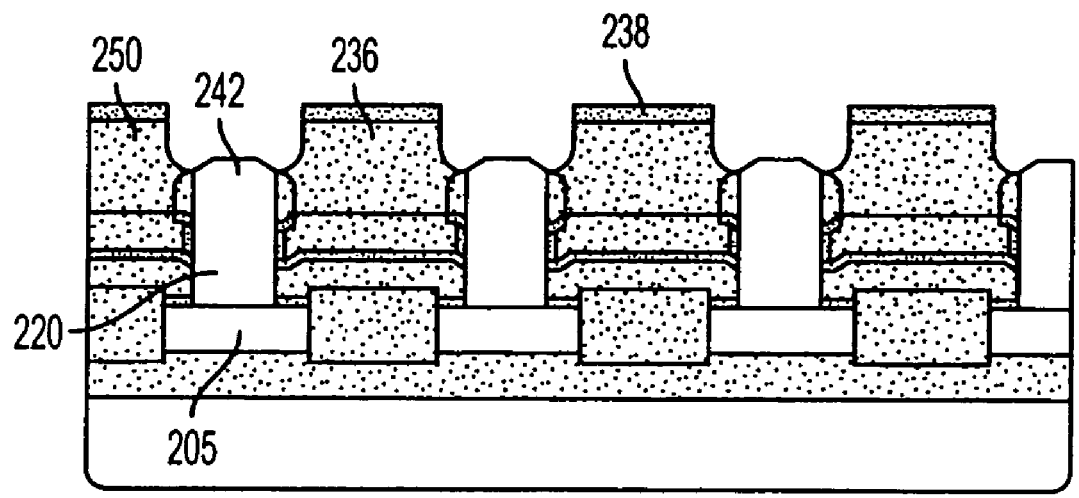
FIG. 33A is a cross-sectional view along an X direction of the exemplary DRAM array at a stage of processing subsequent to that shown in FIGS. 32A-32B.
Figure 33B:
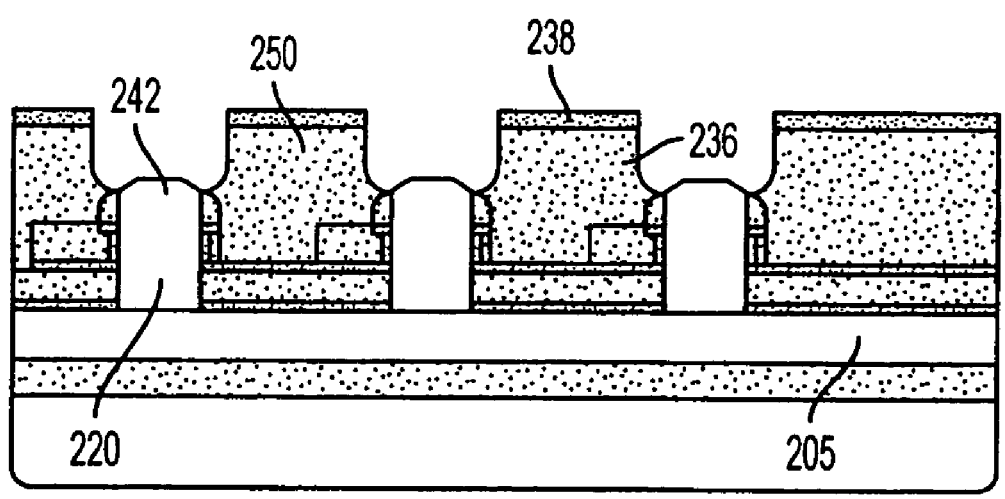
FIG. 33B is a cross-sectional view along a Y direction of the exemplary DRAM array at the stage of processing shown in FIG. 33A.

As shown in FIGS. 33A-33B, the insulator material 236 and the nitride liner are patterned and etched to form recesses 250 in the insulator material to expose the top source/drain region 242 of the pillars 220. A conductive material 252 is then deposited to fill in the recesses 250 and the surface of the wafer is planarized by CMP to remove any conductive material deposited outside of the recesses 250. As will become clearer upon further discussion below, the conductive material 252 filling the recesses 250 contact the top source/drain region 242 of the pillars 220 (see FIGS. 34A-34B) and thus becomes the base portions of the bottom plates of the capacitors to be constructed on top of each WAG vertical transistor 240.

Figure 34A:
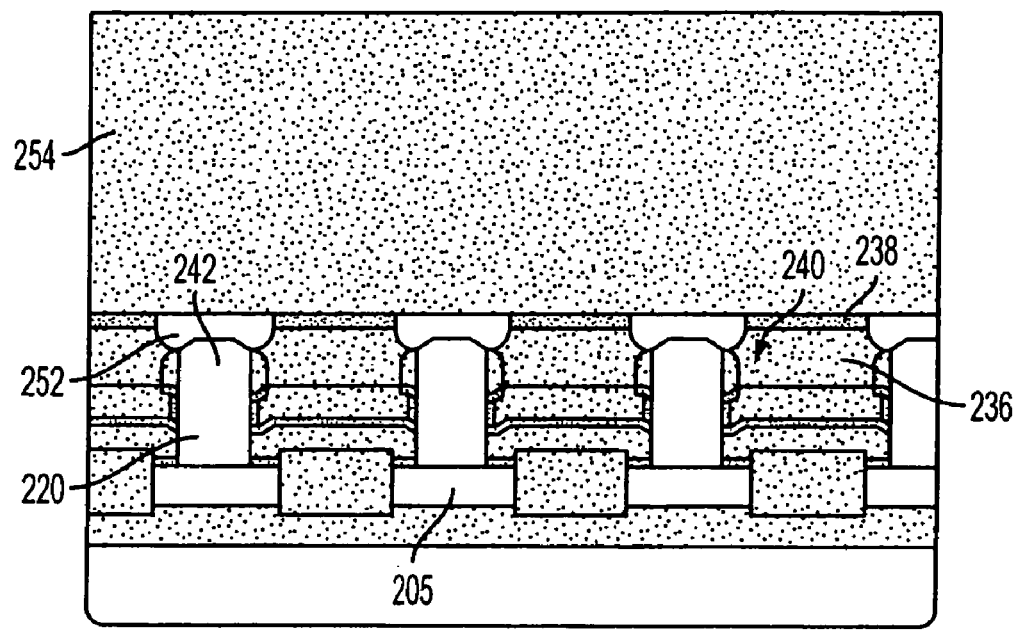
FIG. 34A is a cross-sectional view along an X direction of the exemplary DRAM array at a stage of processing subsequent to that shown in FIGS. 32A-33B.
Figure 34B:
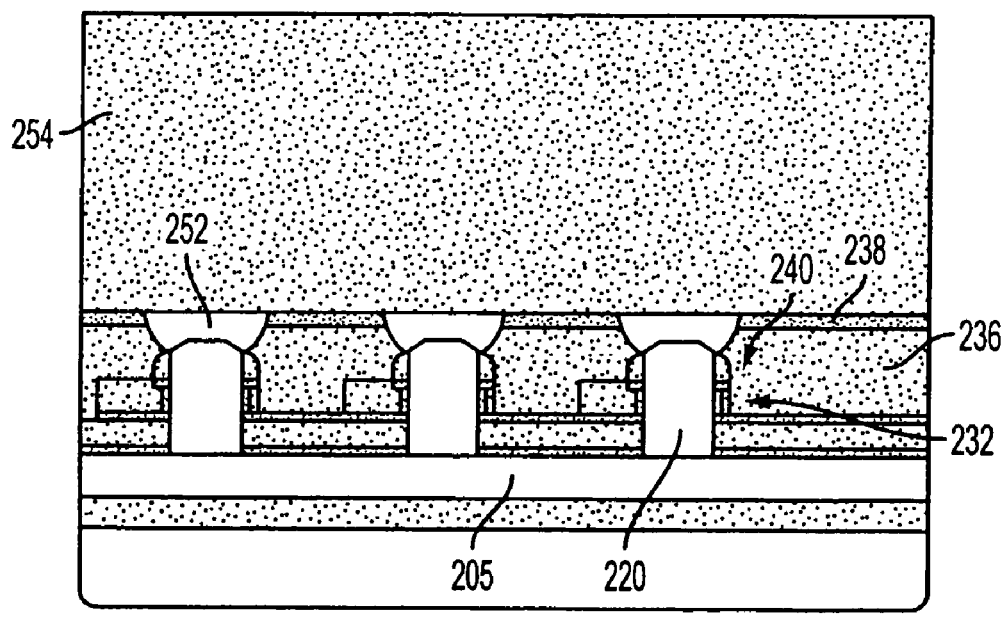
FIG. 34B is a cross-sectional view along a Y direction of the exemplary DRAM array at the stage of processing shown in FIG. 34A.
Figure 35A:
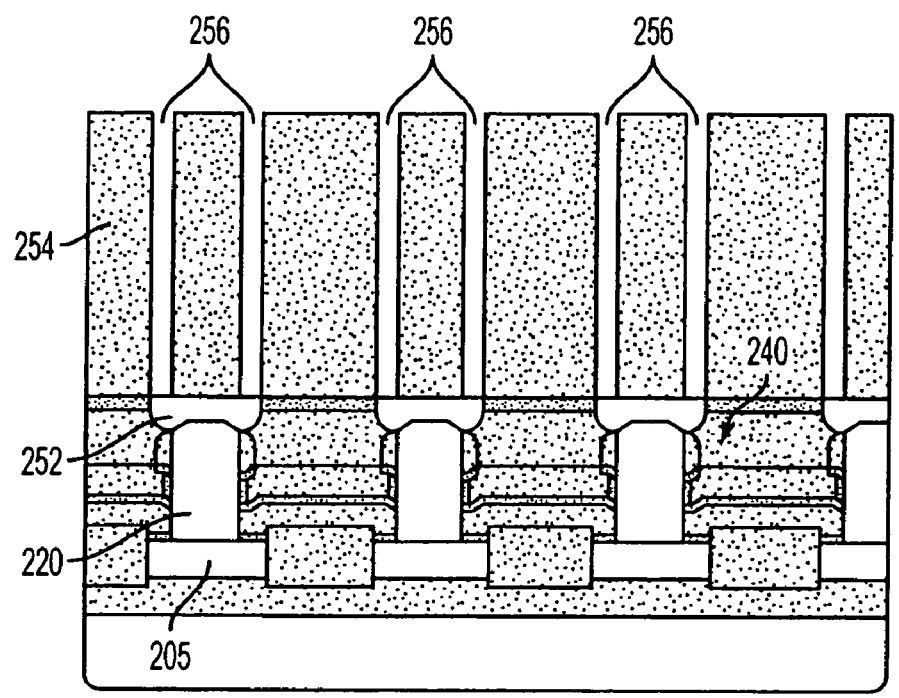
FIG. 35A is a cross-sectional view along an X direction of the exemplary DRAM array at a stage of processing subsequent to that shown in FIGS. 34A-34B.
Figure 35B:
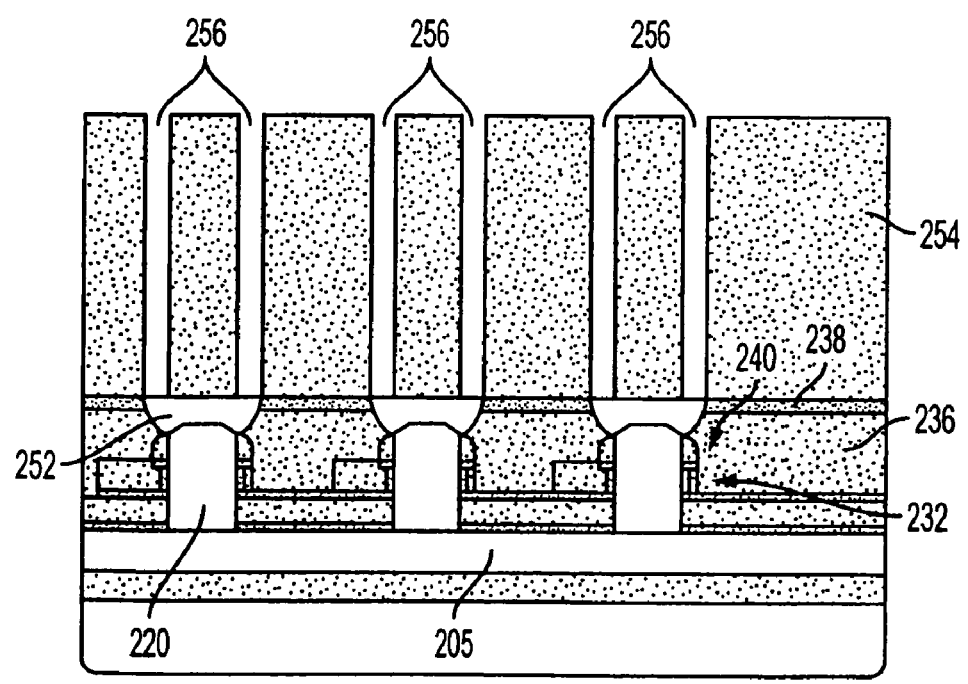
FIG. 35B is a cross-sectional view along a Y direction of the exemplary DRAM array at the stage of processing shown in FIG. 35A.

Next, a thick layer of insulator material 254 is deposited over the insulator material 236 (and nitride liner 238 if applicable) and the conductive material 252, as depicted in FIGS. 34A-34B. The insulator layer may be any suitable insulator material, such as BPSG, TEOS, etc. After deposition of the insulator layer 254, the "container" feature of the capacitors is defined by centering a ring-shaped pattern over each WAG vertical transistor 240, and etching cylindrical holes 256 through the insulator layer 254 to result in the structures seen in FIGS. 35A-35B. Each cylindrical hole 256 is centered over a respective vertical transistor 240 and is aligned over the corresponding region of conductive material 252, preferably with the outer periphery of the cylindrical hole 256 aligned with the periphery of the conductive portion 252.

Figure 36A:
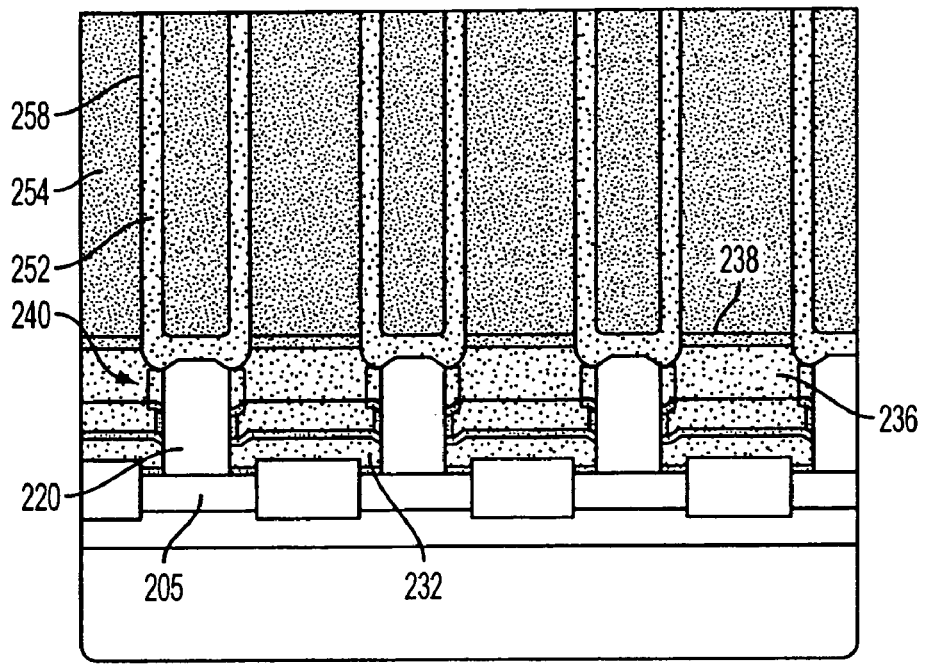
FIG. 36A is a cross-sectional view along an X direction of the exemplary DRAM array at a stage of processing subsequent to that shown in FIGS. 35A-35B.
Figure 36B:
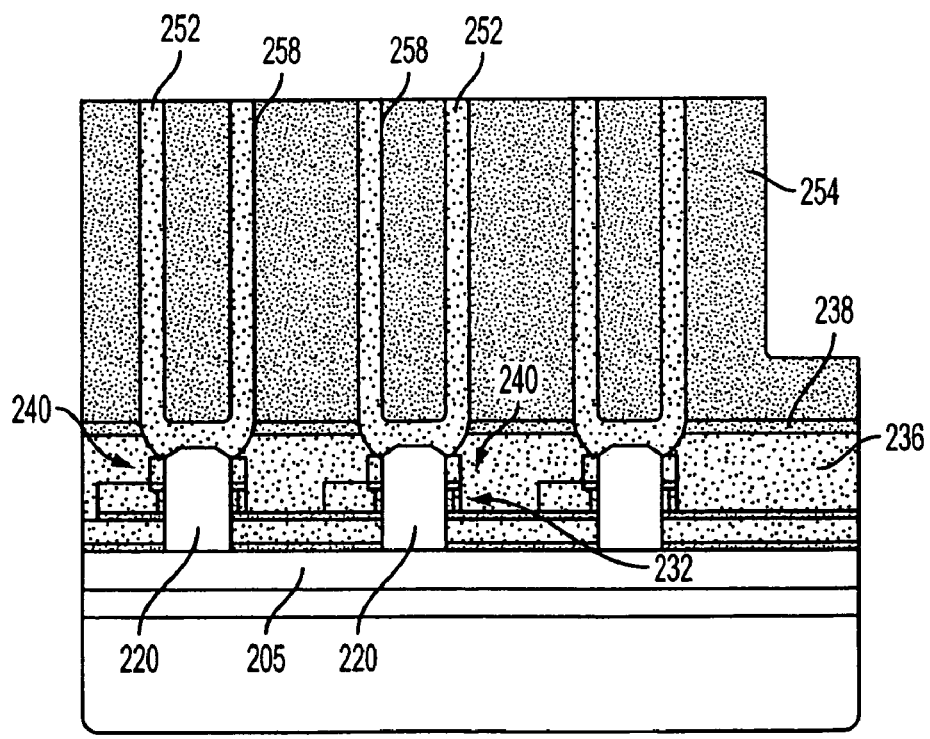
FIG. 36B is a cross-sectional view along a Y direction of the exemplary DRAM array at the stage of processing shown in FIG. 36A.

FIGS. 36A-36B illustrate the next processing stage in which the conductive material 252, i.e., the same conductive material 252 deposited above in connection with FIGS. 34A-34B, is deposited into the cylindrical holes 256. CMP is then performed to remove any excess conductive material 252 from the surface of insulator layer 254. Upon deposition, the conductive material 252 in the cylindrical holes 256 unites with the material deposited into the recesses 250 as described above with reference to FIGS. 34A-34B, to thereby form a bottom capacitor plate 258 over each of the transistors 240. Each bottom capacitor plate 258 will subsequently define a respective container capacitor.

Figure 37A:
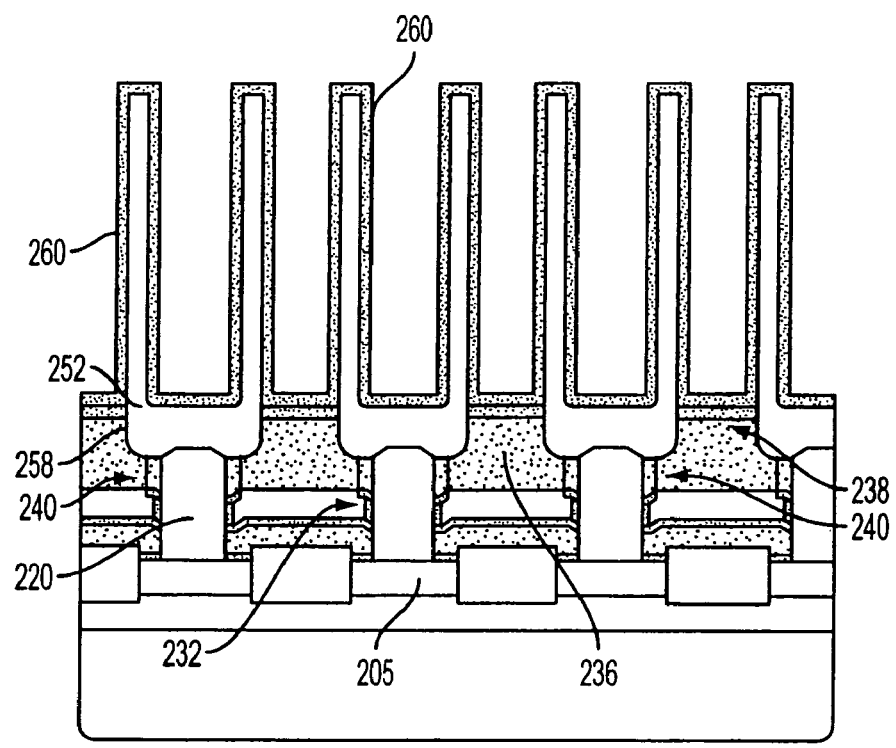
FIG. 37A is a cross-sectional view along an X direction of the exemplary DRAM array at a stage of processing subsequent to that shown in FIGS. 36A-36B.
Figure 37B:
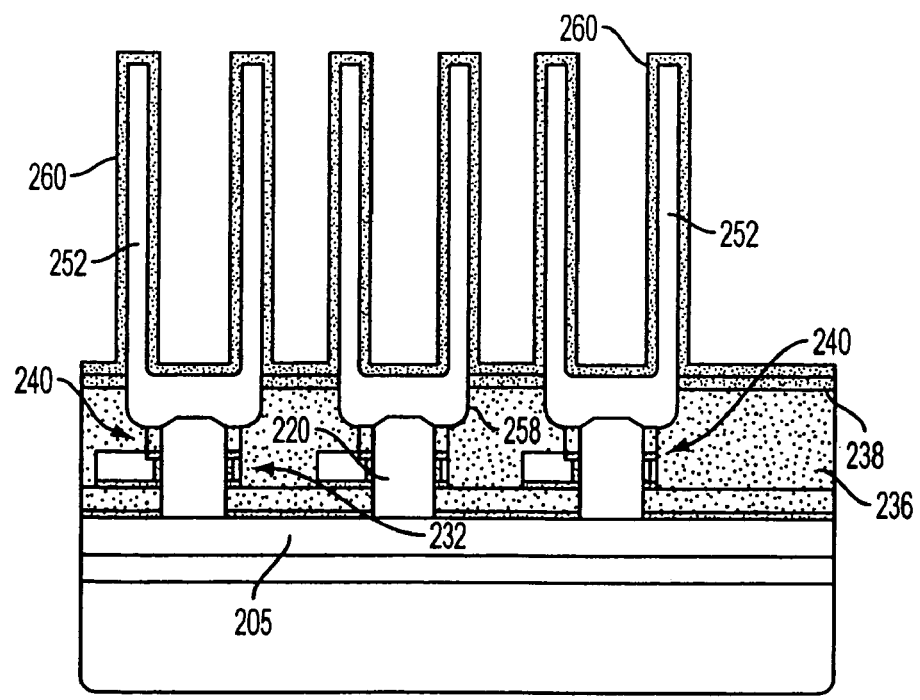
FIG. 37B is a cross-sectional view along a Y direction of the exemplary DRAM array at the stage of processing shown in FIG. 37A.

After forming the bottom capacitor plate 258, the structure shown in FIGS. 37A-37B is produced by removing the insulator material 254 with a wet etch process. Nitride liner 238 stops the etching process from removing insulator layer 236 which surrounds the vertical transistors 240. The etch process stops on the conductive material 252, so that the bottom capacitor plates 258 remain in place upon removal of the insulator layer 254. Removal of the entire layer of insulator material 254 as shown in FIGS. 37A-37B is necessary only for forming a double-sided container capacitor, in which the container capacitor is enabled to store charge at both its interior and exterior surfaces. (Formation of a single-sided container capacitor is explained below.)

Figure 38A:
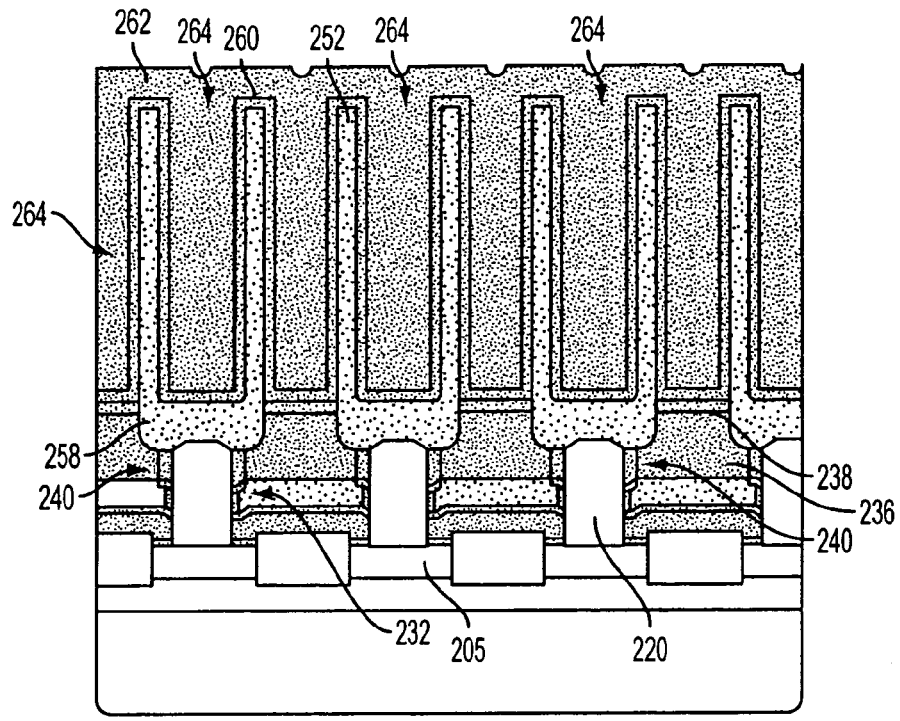
FIG. 38A is a cross-sectional view along an X direction of the exemplary DRAM array at a stage of processing subsequent to that shown in FIGS. 37A-37B.
Figure 38B:
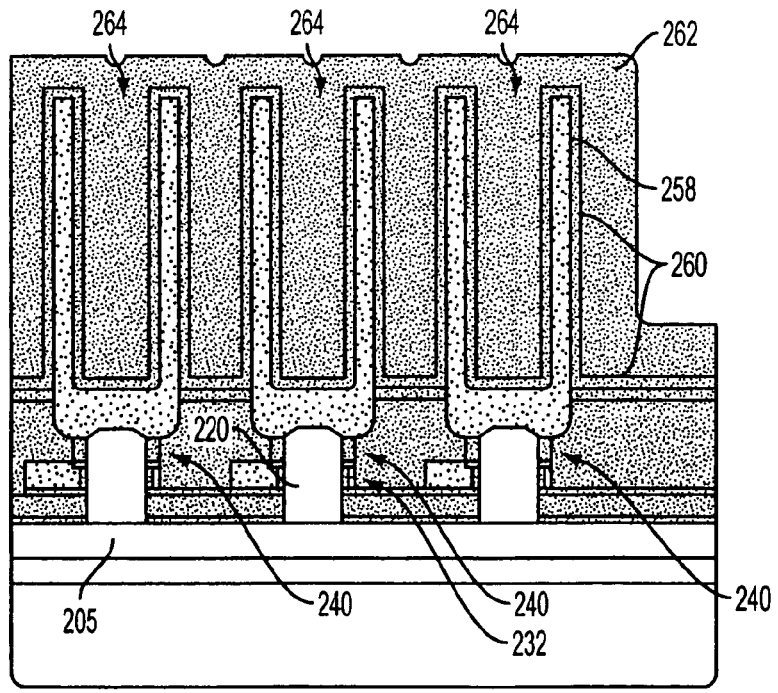
FIG. 38B is a cross-sectional view along a Y direction of the exemplary DRAM array at the stage of processing shown in FIG. 38A.

A capacitor dielectric layer 260 (FIGS. 37A-37B) is subsequently deposited to coat all exposed surfaces of each bottom capacitor plate 258, including both the interior and exterior surfaces thereof. The top capacitor plate 262 is formed by blanket depositing a conductive material to cover the dielectric-coated bottom capacitor plates 258, as seen in FIGS. 38A-38B. As such, the top capacitor plate 262 interfaces with both the interior and exterior of the container-shaped bottom capacitor plate 258 to form a plurality of capacitors 264, with the top capacitor plate 262 being common to all of the capacitors 264.

To form single-sided container capacitors, the processes explained above with respect to FIGS. 32A-36B are the same except that it is not necessary to deposit a nitride liner 238 over the insulator layer 236. Illustrations for these processes would be identical to FIGS. 32A-36B, but without the presence of nitride liner 238. Even without the nitride liner 238, the material used for the insulator layer 254 may be the same material used for layer 236, as the material exterior to the container-shaped bottom capacitor plate 258 does not affect the operation of the transistor 240 or the single-sided container capacitors to be formed, as long as it is insulative.

Figure 39A:
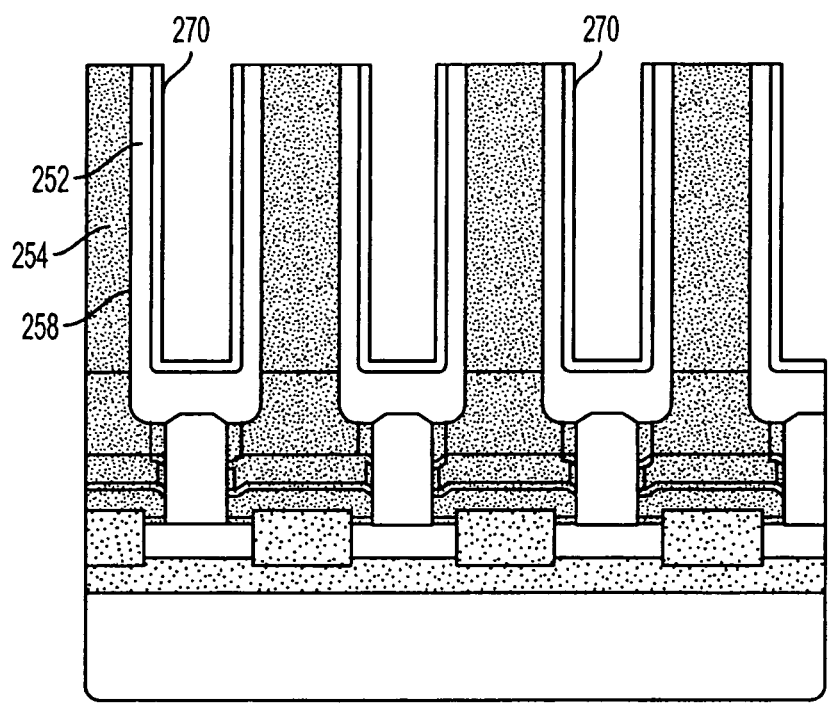
FIG. 39A is a cross-sectional view along an X direction of a second exemplary DRAM array at an intermediate stage of processing.
Figure 39B:
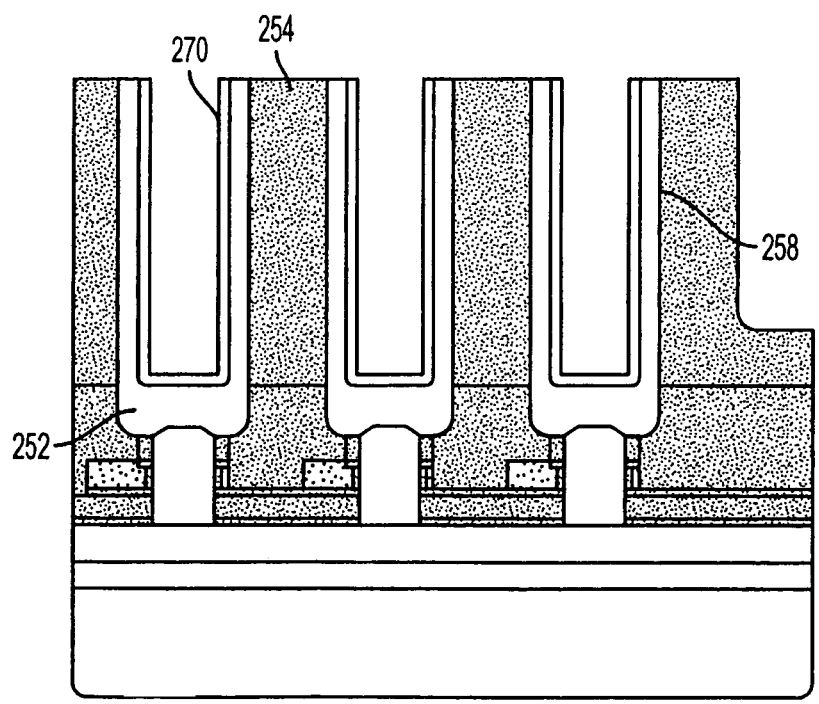
FIG. 39B is a cross-sectional view along a Y direction of the second exemplary DRAM array at the intermediate stage of processing shown in FIG. 39A.

After depositing the conductive material 252 into the cylindrical holes 256 and planarizing the wafer surface to provide the structure depicted in FIGS. 36A-36B, the insulator layer 254 is patterned and etched to remove the insulator material from the interior of the container-shaped bottom capacitor plate 258, as shown in FIGS. 39A-39B. The etch process stops on the conductive material 252 of the bottom capacitor plate 258, so it is not necessary that the photoresist mask used for patterning the etch be exactly aligned over the interior area of the bottom capacitor plate. On the other hand, it is more important that the mask expose the entire area inside the container shape, to ensure that all of the insulator material is removed by the etch process. Subsequently, a dielectric layer 270 is deposited on the exposed surfaces of the bottom capacitor plate 258. Any overhanging dielectric material deposited on the surface of insulator layer 254 may be removed by CMP, if desired, although this is not required.

Figure 40A:
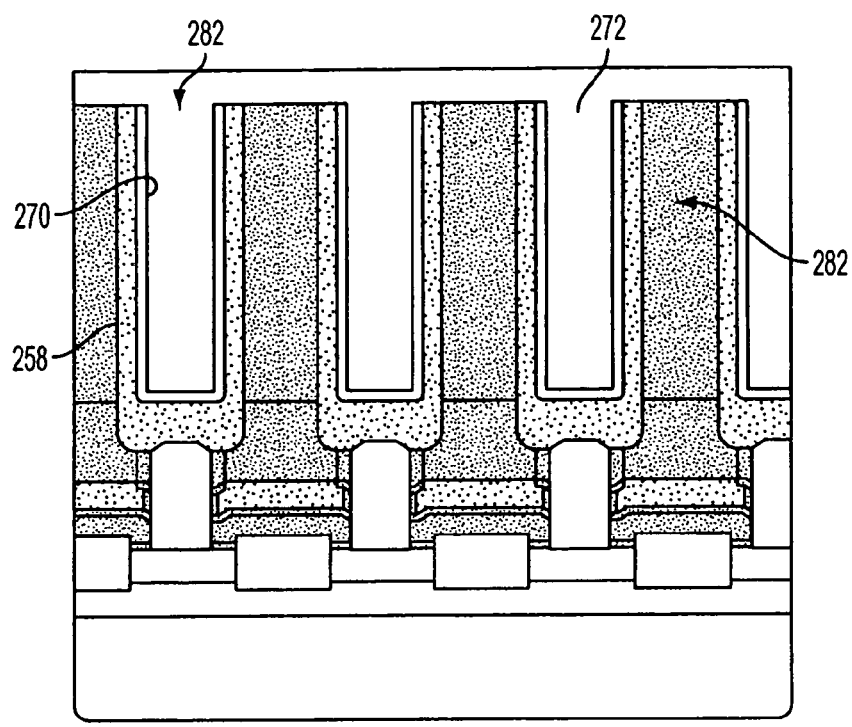
FIG. 40A is a cross-sectional view along an X direction of the second exemplary DRAM array at a stage of processing subsequent to that shown in FIGS. 39A-39B.
Figure 40B:
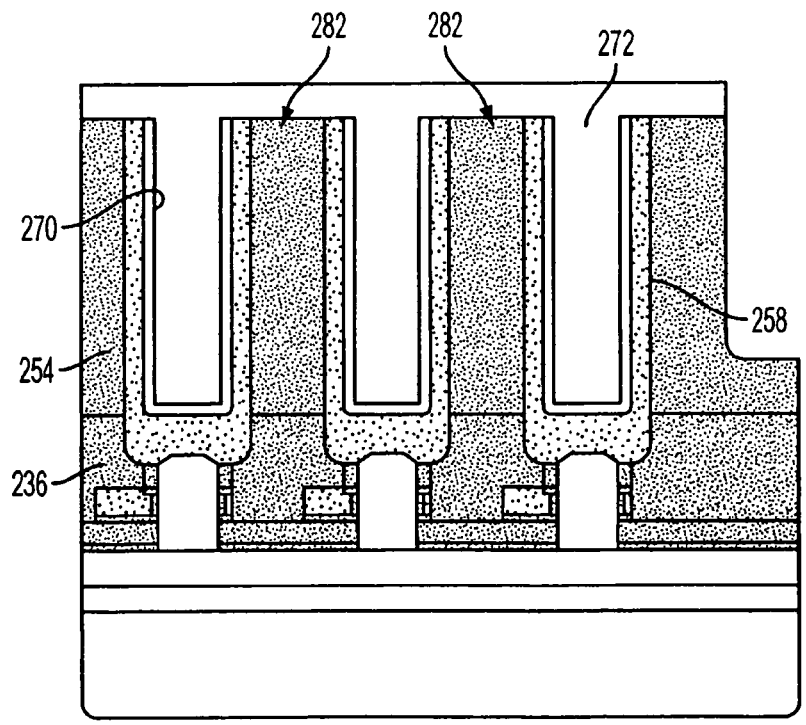
FIG. 40B is a cross-sectional view along a Y direction of the second exemplary DRAM array at the stage of processing shown in FIG. 40A.

FIGS. 40A-40B illustrate the formation of the top capacitor plate 272 in which a conductive material is deposited to fill the interior of the container-shaped bottom capacitor plates 258. The top capacitor plate material is deposited to a level above the top of all the bottom capacitor plates 258 so as to form a single layer which interconnects the interiors of the bottom capacitor plates 258. With the dielectric layer 270 and the upper capacitor plate 272 only interfacing with the bottom capacitor plate 258, the capacitive function of the container-shaped capacitors 282 is only operable at the interior thereof. Again, the top capacitor plate 272 is commonly associated with all of the capacitors 282.

Figure 41:
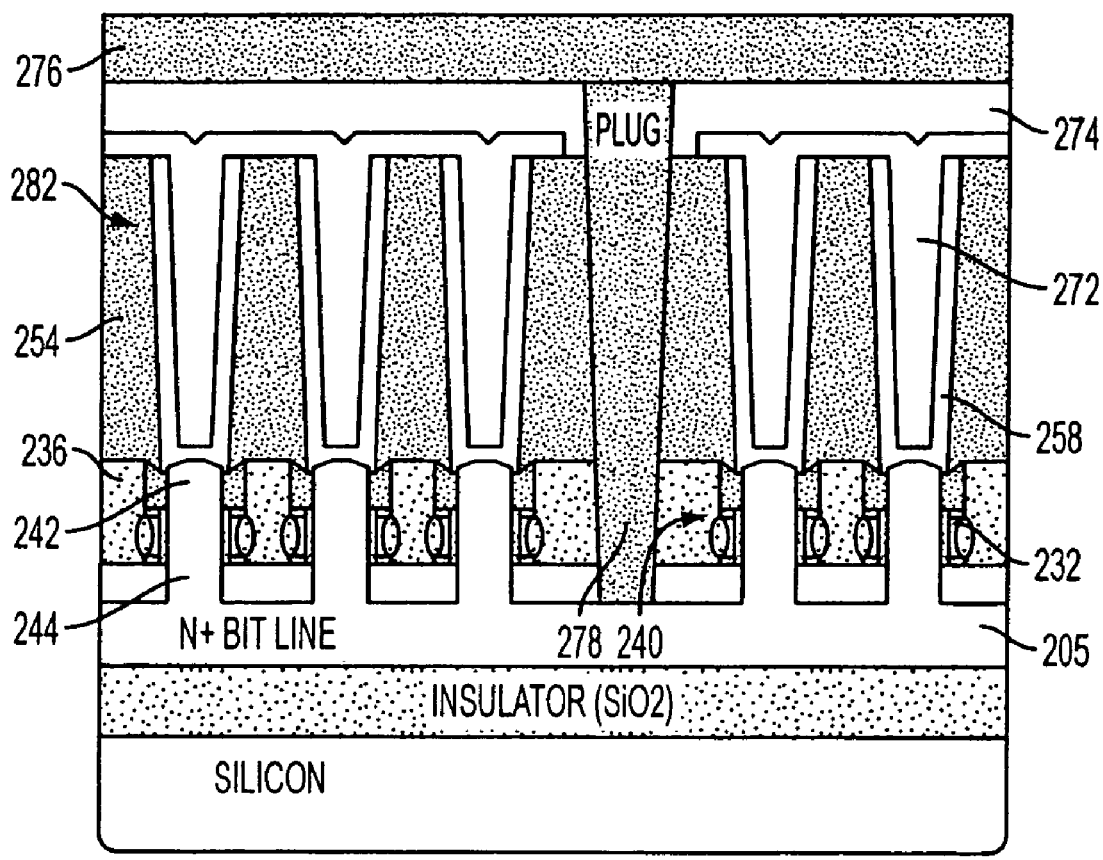
FIG. 41 is a cross-sectional view of a third exemplary DRAM array constructed in accordance with an embodiment of the invention.

Once construction of the capacitors is complete, additional processing may be performed on the wafer structure to connect the DRAM array with other circuit elements. For example, FIG. 41 illustrates a cross section of a portion of a DRAM array that includes a plurality of single-sided container capacitors 282 each respectively stacked onto a corresponding WAG vertical transistor 240. After formation of the upper capacitor plate 272, another insulator layer 274 is deposited over the upper capacitor plate 272. This enables conductive paths such as line 276 to be formed over the DRAM array without interfering with the operation of the DRAM array. In FIG. 41, a contact plug 278 connects the buried bit line 205 to elements outside of the DRAM array via the conductive line 276, which is connected to the other end of the contact plug 278.

As demonstrated herein, an exemplary DRAM array constructed in accordance with the present invention includes an array of storage cells in which each cell includes a wrap-around-gate vertical transistor self-aligned and connected in rows to a plurality of buried digit lines (which may be silicided to reduce resistance), and with each WAG vertical transistor having a container-type capacitor stacked thereon. Since the polysilicon pillar forming the core of each transistor is epitaxially grown vertically from the digit line, the pillar can be no wider than the digit line. The total width of each transistor is determined by the width of the nitride spacers formed around the upper sidewalls of the pillars. Thus, each transistor occupies little more than the width of a buried digit line, or may even be as wide as or thinner than the buried digit line, if desired. If the external diameter across each container capacitor also substantially corresponds with the width of the buried digit line and/or vertical transistor, an array of such cells would yield an extremely efficient use of semiconductor real estate.

Figure 43:
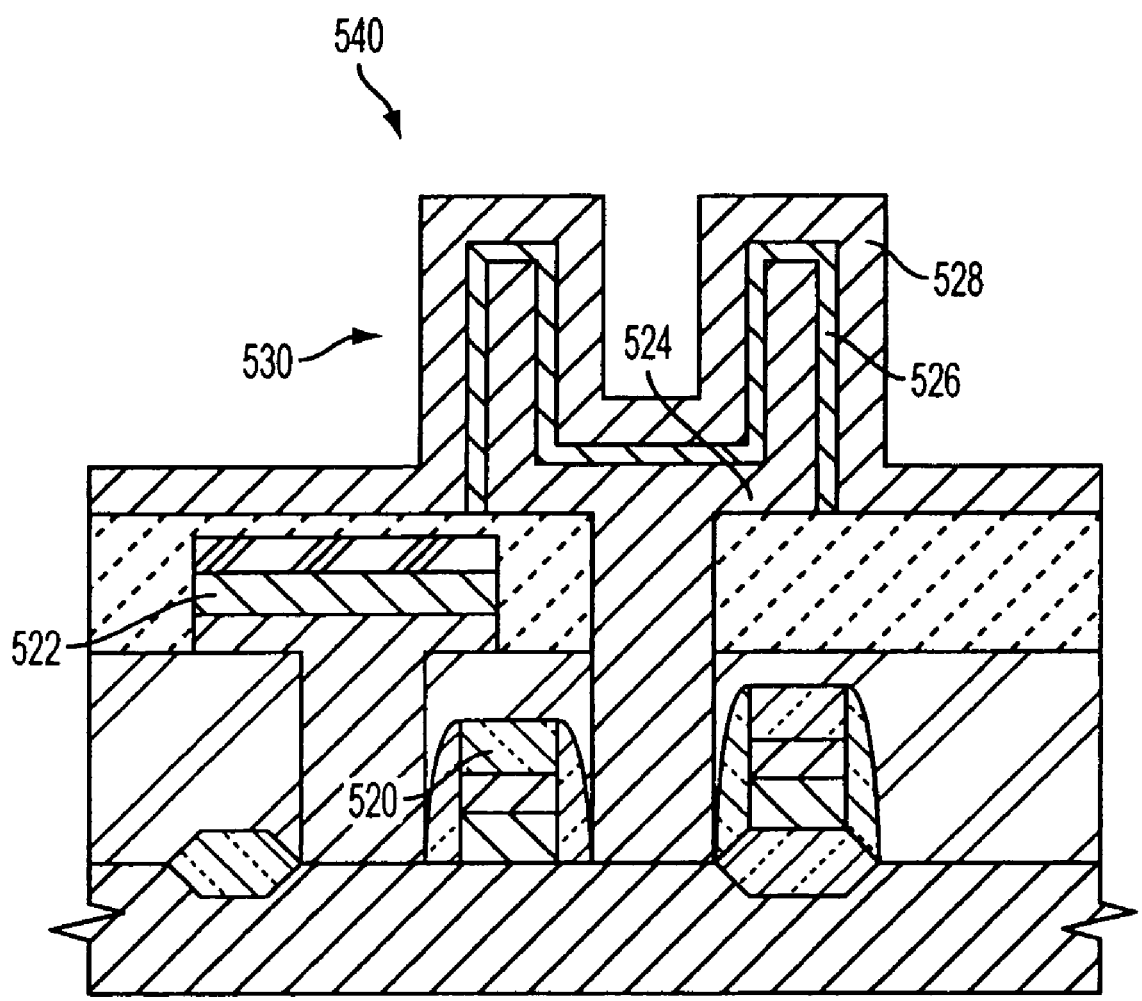
FIG. 43 is a cross-sectional view of a conventional DRAM cell.

To emphasize the advantage of the invention in this regard, a typical DRAM cell 540 is shown in FIG. 43. The basic elements in the conventional DRAM cell 540 include a transistor 520, a bit line 522, and a capacitor structure 530 comprised of a bottom cell plate 524, a dielectric layer 526 and a top cell plate 528, similar to the DRAM cell produced according to the principles of this invention. In contrast to the DRAM cell produced according to the invention, however, it can be seen that the width of the conventional DRAM cell 540 is approximately equal to the combined width of the bit line 522 plus the width of the capacitor 530. In particular, each of the bit line 522, the transistor 520, and the capacitor 528 occupies a portion of the surface area of the substrate, whereas the present invention provides a DRAM cell having its entire width being substantially that of the width of a bit line. This distinction clearly enables a DRAM array that incorporates the invention to be constructed to a much higher density than a DRAM array based on the conventional DRAM cell 540.

Another advantage achieved upon incorporating the present invention into the formation a DRAM array is that the inventive concepts render the array fairly simple to construct. In addition to the various aspects of the invention described above with respect to the WAG vertical transistor that contribute to a relatively simple fabrication process, additional process advantages are realized when such WAG vertical transistors are included in the construction of a DRAM array. For example, the polysilicon core of each wrap-around-gate is epitaxially grown from a respective digit line. Similarly, the transistor gates in each column of the array are connected by the gate interconnect patterns which are unitarily formed with the wrap-around-gates. Thus, the digit lines and word lines are "automatically" connected to the WAG vertical transistor upon formation of the transistor, without the need to provide any additional structure to achieve these connections. Additionally, the capacitor cells can be formed in direct contact with the source/drain, thus eliminating the need to provide a contact path between the transistor and the capacitor. The arrangement of forming the capacitors directly over the vertical transistors further enhances the feasibility of manufacturing a very high density DRAM array.

Figure 44:
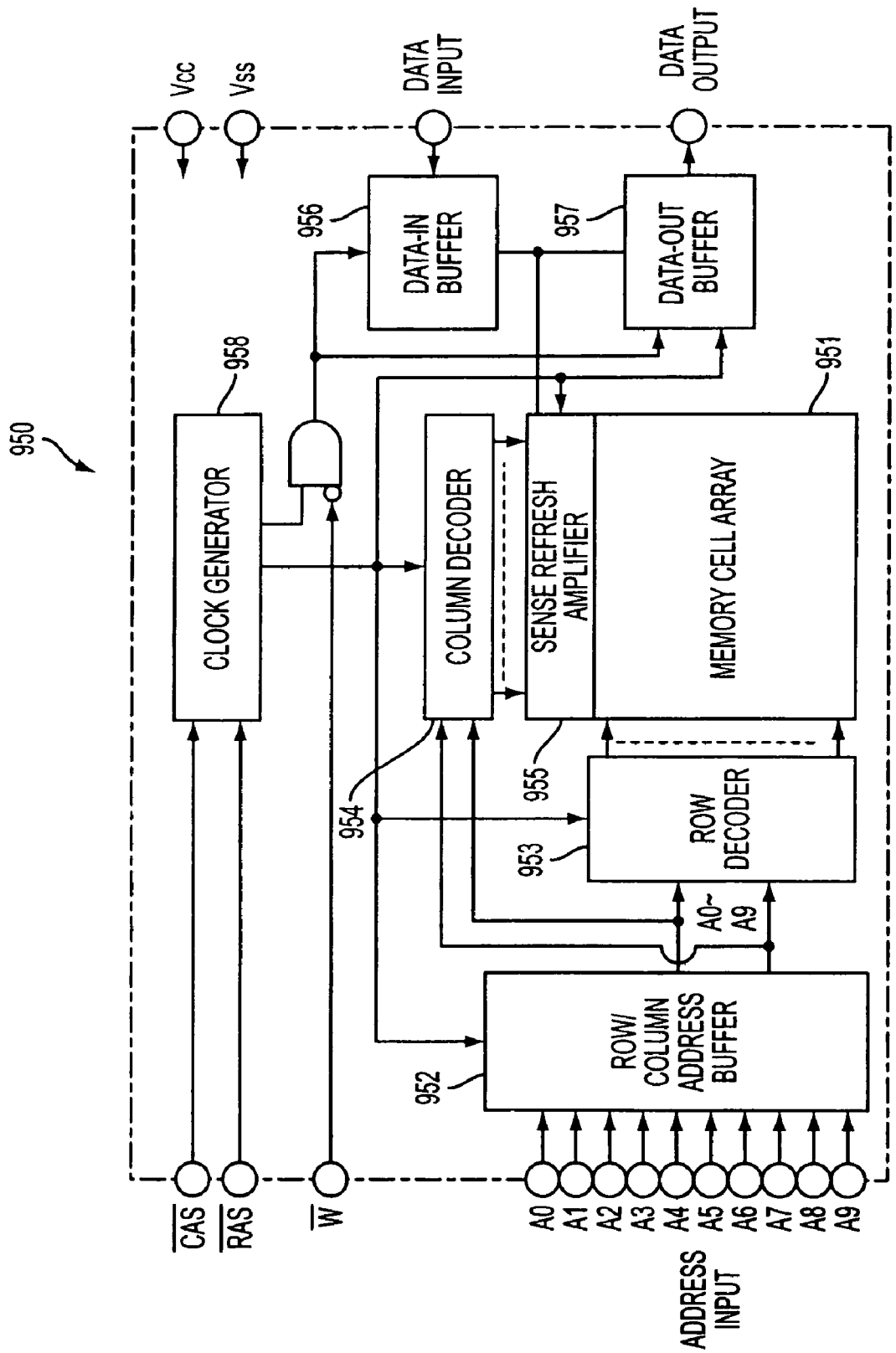
FIG. 44 is a diagram illustrating an exemplary memory device incorporating the invention.

As with conventional DRAM arrays, a DRAM array formed according to the invention must communicate with peripheral circuitry to control the storage operations of the memory cell array. FIG. 44 is a block diagram of an exemplary DRAM memory device 950 that includes a DRAM array 951, formed according to the invention, and the aforementioned peripheral circuitry. Specifically, DRAM memory device 950 includes the memory cell array 951 for storing data; a row/column address buffer 952 for receiving external address signals for selecting a memory cell; a row decoder 953 and a column decoder 954 for selecting memory cells by decoding the address signals; a sense refresh amplifier 955 for amplifying and reading a signal stored in the designated memory cell; a data-in buffer 956 and a data-out buffer 957 for inputting/outputting data; and a clock generator 958 for generating a clock signal.

Figure 45:
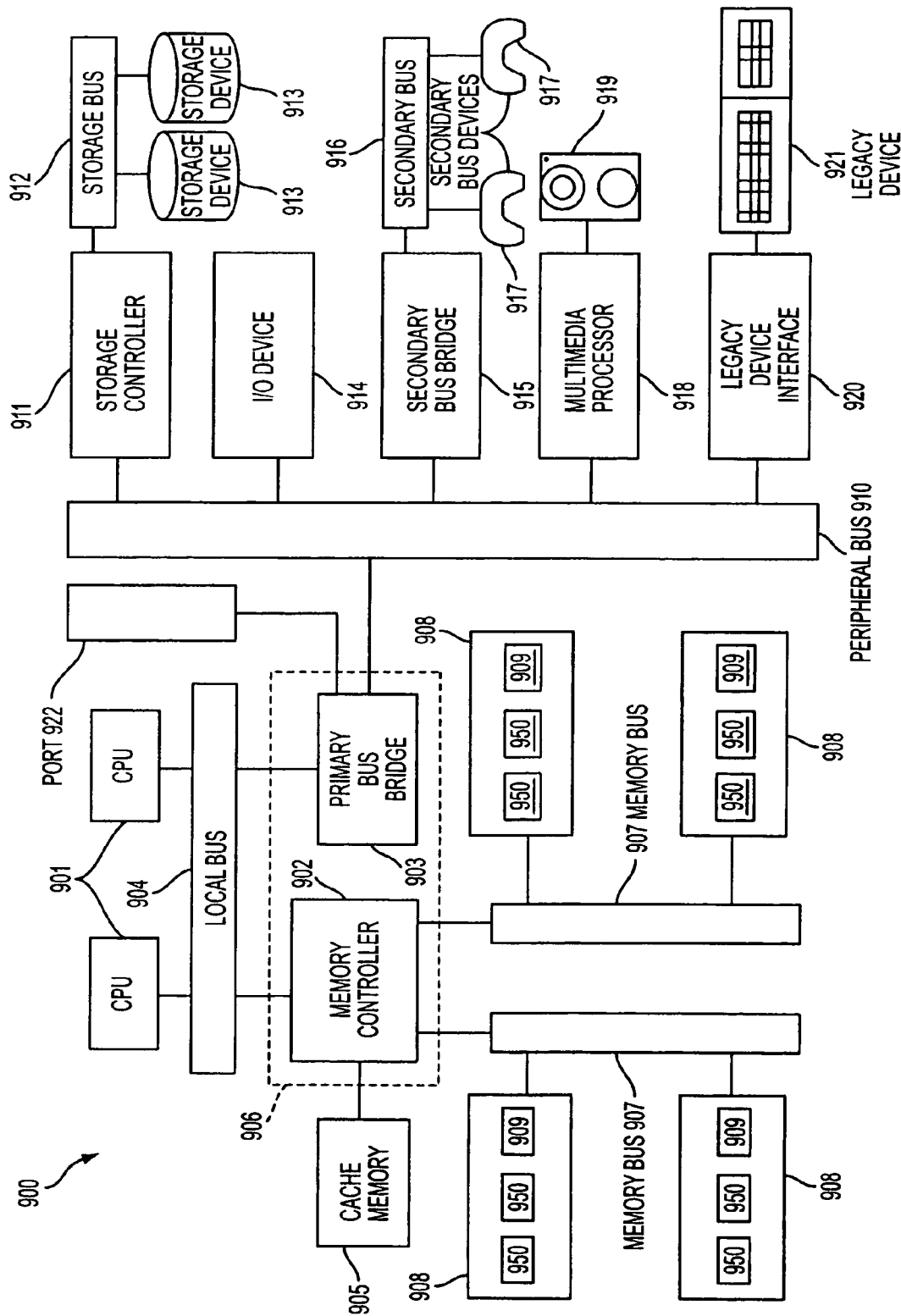
FIG. 45 is a diagram illustrating an exemplary processing system incorporating the memory device of FIG. 44.

FIG. 45 illustrates an exemplary processing system 900 which may utilize the memory device 950 of FIG. 44. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 950. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915 communicating with a secondary bus 916, a multimedia processor 918, and a legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge 915 may be used to interface additional devices via another bus to the processing system. For example, the secondary bus bridge may be a universal serial port (USB) controller used to couple USB devices 917 via a secondary bus 916 and the secondary bus bridge 915 to the processing system 900. The multimedia processor 918 may be a sound card, a video capture card, or any other type of media interface, which may also be coupled to one or more additional devices such as speakers 919. The legacy device interface 920 is used to couple at least one legacy device 921, for example, older style keyboards and mice, to the processing system 900.

The processing system 900 illustrated in FIG. 45 is only an exemplary processing system with which the invention may be used. While FIG. 45 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 950. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention is described in connection with specific dimensional values and/or materials used for the layers of the memory cells, it should be readily apparent that other dimensional values and/or materials may be substituted for those specifically mentioned. Accordingly, the invention is not limited by the foregoing description or drawings, but is only limited by the scope of the appended claims.

What is claimed as new and desired to be protected by Letters Patent of the United States is:

1. A semiconductor structure containing a vertical transistor, comprising:
    a substrate, wherein at least a portion of the work surface of the substrate is formed of polysilicon;
    a polysilicon pillar extending vertically from the polysilicon surface of the substrate, the pillar having a top end, a top portion, a central portion, and a bottom portion;
    a first source/drain region defined in the top portion of the pillar;
    a channel region defined in the central portion of the pillar;
    a second source/drain region defined in the bottom portion of the pillar;
    a dielectric layer surrounding the central portion of the pillar and being in alignment with the channel region of the transistor;
    a transistor gate surrounding the central portion of the pillar with the dielectric layer between the transistor gate and the pillar, the transistor gate being aligned with the channel region of the transistor; and
    a spacer layer formed around only the top portion of the pillar and the first source/drain region.

2. The structure according to claim 1, wherein the thickness of the transistor gate corresponds with the thickness of the spacer layer.

3. The structure according to claim 2, wherein the top end of the pillar has been silicided.

4. The structure according to claim 2, wherein the spacer layer comprises a nitride material.

5. The structure according to claim 1, further comprising a conductive path extending away from the transistor gate, wherein the conductive path and the transistor gate are formed of the same material, and the conductive path is formed as an extension of the transistor gate.

6. The structure according to claim 5, wherein the transistor gate and conductive path are formed of metal.

7. The structure according to claim 5, wherein the transistor gate and conductive path are formed of polysilicon.

8. The structure according to claim 7, wherein the conductive path in a silicided conductive path.

9. The structure according to claim 5, further comprising at least one conductive plug, each conductive plug respectively contacting one of the first source/drain region, the polysilicon portion of the substrate from which the pillar extends, and the conductive path extending from the transistor gate.

* * * * *